(12) United States Patent
Melanson

(10) Patent No.: US 7,821,237 B2
(45) Date of Patent: Oct. 26, 2010

(54) POWER FACTOR CORRECTION (PFC) CONTROLLER AND METHOD USING A FINITE STATE MACHINE TO ADJUST THE DUTY CYCLE OF A PWM CONTROL SIGNAL

(75) Inventor: John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 90 days.

(21) Appl. No.: 12/107,613

(22) Filed: Apr. 22, 2008

(65) Prior Publication Data

US 2008/0272748 A1 Nov. 6, 2008

Related U.S. Application Data

(60) Provisional application No. 60/915,547, filed on May 2, 2007.

(51) Int. Cl.
*G05F 1/00* (2006.01)
(52) U.S. Cl. .................. 323/222; 323/283; 323/285
(58) Field of Classification Search .................. 323/222, 323/283, 285
See application file for complete search history.

(56) References Cited

U.S. PATENT DOCUMENTS

| | | |
|---|---|---|
| 3,790,878 A | 2/1974 | Brokaw |
| 3,881,167 A | 4/1975 | Pelton et al. |
| 4,075,701 A | 2/1978 | Hofmann |
| 4,334,250 A | 6/1982 | Theus |
| 4,414,493 A | 11/1983 | Henrich |
| 4,476,706 A | 10/1984 | Hadden et al. |
| 4,677,366 A | 6/1987 | Wilkinson et al. |
| 4,683,529 A | 7/1987 | Bucher |
| 4,700,188 A | 10/1987 | James |
| 4,737,658 A | 4/1988 | Kronmuller et al. |

(Continued)

FOREIGN PATENT DOCUMENTS

EP 0585789 A1 3/1994

(Continued)

OTHER PUBLICATIONS

D. Hausman, Lutron, RTISS-TE Operation, Real-Time Illumination Stability Systems for Trailing-Edge (Reverse Phase Control) Dimmers, v. 1.0 Dec. 2004.

(Continued)

*Primary Examiner*—Shawn Riley
(74) *Attorney, Agent, or Firm*—Steven Lin, Esq.

(57) ABSTRACT

A power factor correction (PFC) controller and method uses a finite state machine to adjust the duty cycle of a pulse width modulation (PWM) switching control signal. The PFC controller has a target current generator that receives the link output voltage and generates a target current proportionate to the rectified line input voltage. The PFC controller further includes a comparator which outputs a two-level current comparison result signal. The finite state machine responsive to the two-level current comparison result signal, generates a switch control signal that has a duty cycle which is adjusted for controlling the switch so that the sensed current is approximately proportionate to the rectified line input voltage, such that power factor correction is performed.

35 Claims, 34 Drawing Sheets

U.S. PATENT DOCUMENTS

| | | |
|---|---|---|
| 4,797,633 A | 1/1989 | Humphrey |
| 4,940,929 A | 7/1990 | Williams |
| 4,973,919 A | 11/1990 | Allfather |
| 4,979,087 A | 12/1990 | Sellwood et al. |
| 4,992,919 A | 2/1991 | Lee et al. |
| 4,994,952 A | 2/1991 | Silva et al. |
| 5,206,540 A | 4/1993 | de Sa e Silva et al. |
| 5,278,490 A | 1/1994 | Smedley |
| 5,323,157 A | 6/1994 | Ledzius et al. |
| 5,359,180 A | 10/1994 | Park et al. |
| 5,383,109 A | 1/1995 | Maksimovic et al. |
| 5,477,481 A | 12/1995 | Kerth |
| 5,481,178 A | 1/1996 | Wilcox et al. |
| 5,565,761 A | 10/1996 | Hwang |
| 5,638,265 A | 6/1997 | Gabor |
| 5,691,890 A | 11/1997 | Hyde |
| 5,747,977 A | 5/1998 | Hwang |
| 5,781,040 A | 7/1998 | Myers |
| 5,783,909 A | 7/1998 | Hochstein |
| 5,844,399 A * | 12/1998 | Stuart ......................... 323/282 |
| 5,900,683 A | 5/1999 | Rinehart et al. |
| 5,929,400 A | 7/1999 | Colby et al. |
| 5,946,202 A | 8/1999 | Balogh |
| 5,952,849 A | 9/1999 | Haigh et al. |
| 5,963,086 A | 10/1999 | Hall |
| 5,966,297 A | 10/1999 | Minegishi |
| 5,994,885 A | 11/1999 | Wilcox et al. |
| 6,016,038 A | 1/2000 | Mueller et al. |
| 6,043,633 A | 3/2000 | Lev et al. |
| 6,072,969 A | 6/2000 | Yokomori et al. |
| 6,083,276 A | 7/2000 | Davidson et al. |
| 6,084,450 A | 7/2000 | Smith et al. |
| 6,150,774 A | 11/2000 | Mueller et al. |
| 6,211,626 B1 | 4/2001 | Lys et al. |
| 6,211,627 B1 | 4/2001 | Callahan |
| 6,229,271 B1 | 5/2001 | Liu |
| 6,246,183 B1 | 6/2001 | Buonavita |
| 6,259,614 B1 | 7/2001 | Ribarich et al. |
| 6,300,723 B1 | 10/2001 | Wang et al. |
| 6,304,066 B1 | 10/2001 | Wilcox et al. |
| 6,304,473 B1 | 10/2001 | Telefus et al. |
| 6,344,811 B1 | 2/2002 | Melanson |
| 6,385,063 B1 | 5/2002 | Sadek et al. |
| 6,407,691 B1 | 6/2002 | Yu |
| 6,441,558 B1 | 8/2002 | Muthu et al. |
| 6,445,600 B2 | 9/2002 | Ben-Yaakov |
| 6,452,521 B1 | 9/2002 | Wang |
| 6,495,964 B1 | 12/2002 | Hayes |
| 6,509,913 B2 | 1/2003 | Martin, Jr. et al. |
| 6,580,258 B2 | 6/2003 | Wilcox et al. |
| 6,583,550 B2 | 6/2003 | Iwasa et al. |
| 6,636,003 B2 | 10/2003 | Rahm et al. |
| 6,713,974 B2 | 3/2004 | Patchornik et al. |
| 6,727,832 B1 | 4/2004 | Melanson |
| 6,741,123 B1 | 5/2004 | Andersen et al. |
| 6,753,661 B2 | 6/2004 | Muthu et al. |
| 6,768,655 B1 | 7/2004 | Yang et al. |
| 6,781,351 B2 | 8/2004 | Mednik et al. |
| 6,788,011 B2 | 9/2004 | Mueller et al. |
| 6,806,659 B1 | 10/2004 | Mueller et al. |
| 6,839,247 B1 | 1/2005 | Yang |
| 6,860,628 B2 | 3/2005 | Robertson et al. |
| 6,870,325 B2 | 3/2005 | Bushell et al. |
| 6,873,065 B2 | 3/2005 | Haigh et al. |
| 6,882,552 B2 | 4/2005 | Telefus et al. |
| 6,888,322 B2 | 5/2005 | Dowling et al. |
| 6,894,471 B2 | 5/2005 | Corva et al. |
| 6,933,706 B2 | 8/2005 | Shih |
| 6,940,733 B2 | 9/2005 | Schie et al. |
| 6,944,034 B1 | 9/2005 | Shteynberg et al. |
| 6,956,750 B1 | 10/2005 | Eason et al. |
| 6,958,920 B2 | 10/2005 | Mednik et al. |
| 6,967,448 B2 | 11/2005 | Morgan et al. |
| 6,970,503 B1 | 11/2005 | Kalb |
| 6,975,079 B2 | 12/2005 | Lys et al. |
| 7,003,023 B2 | 2/2006 | Krone et al. |
| 7,050,509 B2 | 5/2006 | Krone et al. |
| 7,064,498 B2 | 6/2006 | Dowling et al. |
| 7,064,531 B1 | 6/2006 | Zinn |
| 7,075,329 B2 | 7/2006 | Chen et al. |
| 7,078,963 B1 | 7/2006 | Andersen et al. |
| 7,088,059 B2 | 8/2006 | McKinney et al. |
| 7,102,902 B1 | 9/2006 | Brown et al. |
| 7,106,603 B1 | 9/2006 | Lin et al. |
| 7,109,791 B1 | 9/2006 | Epperson et al. |
| 7,135,824 B2 | 11/2006 | Lys et al. |
| 7,145,295 B1 | 12/2006 | Lee et al. |
| 7,158,633 B1 | 1/2007 | Hein |
| 7,161,816 B2 | 1/2007 | Shteynberg et al. |
| 7,183,957 B1 | 2/2007 | Melanson |
| 7,221,130 B2 | 5/2007 | Ribeiro et al. |
| 7,233,135 B2 | 6/2007 | Noma et al. |
| 7,255,457 B2 | 8/2007 | Ducharm et al. |
| 7,266,001 B1 | 9/2007 | Notohamiprodjo et al. |
| 7,288,902 B1 | 10/2007 | Melanson |
| 7,292,013 B1 | 11/2007 | Chen et al. |
| 7,310,244 B2 | 12/2007 | Yang et al. |
| 7,538,499 B2 | 5/2009 | Ashdown |
| 7,545,130 B2 | 6/2009 | Latham |
| 7,554,473 B2 | 6/2009 | Melanson |
| 7,569,996 B2 | 8/2009 | Holmes et al. |
| 7,656,103 B2 | 2/2010 | Shteynberg et al. |
| 2002/0145041 A1 | 10/2002 | Muthu et al. |
| 2002/0150151 A1 | 10/2002 | Krone et al. |
| 2002/0166073 A1 | 11/2002 | Nguyen et al. |
| 2003/0095013 A1 | 5/2003 | Melanson et al. |
| 2003/0223255 A1 | 12/2003 | Ben-Yaakov |
| 2004/0046683 A1 | 3/2004 | Mitamura et al. |
| 2004/0085030 A1 | 5/2004 | Laflamme et al. |
| 2004/0085117 A1 | 5/2004 | Melbert et al. |
| 2004/0169477 A1 | 9/2004 | Yancie et al. |
| 2004/0227571 A1 | 11/2004 | Kuribayashi |
| 2004/0228116 A1 | 11/2004 | Miller et al. |
| 2004/0232971 A1 | 11/2004 | Kawasaki et al. |
| 2004/0239262 A1 | 12/2004 | Ido et al. |
| 2005/0057237 A1 | 3/2005 | Clavel |
| 2005/0156770 A1 | 7/2005 | Melanson |
| 2005/0184895 A1 | 8/2005 | Petersen et al. |
| 2005/0207190 A1 | 9/2005 | Gritter |
| 2005/0218838 A1 | 10/2005 | Lys |
| 2005/0253533 A1 | 11/2005 | Lys et al. |
| 2005/0270813 A1 | 12/2005 | Zhang et al. |
| 2005/0275354 A1 | 12/2005 | Hausman, Jr. et al. |
| 2005/0275386 A1 | 12/2005 | Jepsen et al. |
| 2006/0022916 A1 | 2/2006 | Aiello |
| 2006/0023002 A1 | 2/2006 | Hara et al. |
| 2006/0125420 A1 | 6/2006 | Boone et al. |
| 2006/0226795 A1 | 10/2006 | Walter et al. |
| 2006/0261754 A1 | 11/2006 | Lee |
| 2007/0029946 A1 | 2/2007 | Yu et al. |
| 2007/0040512 A1 | 2/2007 | Jungwirth et al. |
| 2007/0053182 A1 | 3/2007 | Robertson |
| 2007/0103949 A1 | 5/2007 | Tsuruya |
| 2007/0182699 A1 | 8/2007 | Ha et al. |
| 2008/0174372 A1 | 7/2008 | Tucker et al. |
| 2008/0192509 A1 | 8/2008 | Dhuyvetter et al. |
| 2008/0224635 A1 | 9/2008 | Hayes |
| 2008/0259655 A1 | 10/2008 | Wei et al. |
| 2008/0278132 A1 | 11/2008 | Kesterson et al. |
| 2009/0147544 A1 | 6/2009 | Melanson |

2009/0218960 A1    9/2009    Lyons et al.

FOREIGN PATENT DOCUMENTS

| EP | 0910168 A1 | 4/1999 |
|---|---|---|
| EP | 1014563 | 6/2000 |
| EP | 1164819 A | 12/2001 |
| EP | 1213823 A2 | 6/2002 |
| EP | 1528785 A | 5/2005 |
| WO | 01/97384 A | 12/2001 |
| WO | WO0227944 | 4/2002 |
| WO | 02/091805 A2 | 11/2002 |
| WO | WO 2006/022107 A2 | 3/2006 |
| WO | 2006/067521 A | 6/2006 |
| WO | WO2006135584 | 12/2006 |
| WO | 2007/026170 A | 3/2007 |
| WO | 2007/079362 A | 7/2007 |

OTHER PUBLICATIONS

International Rectifier, Data Sheet No. PD60230 revC, IR1150(S)(PbF), uPFC One Cycle Control PFC IC Feb. 5, 2007.
Texas Instruments, Application Report SLUA308, UCC3817 Current Sense Transformer Evaluation, Feb. 2004.
Texas Instruments, Application Report SPRA902A, Average Current Mode Controlled Power Factor Correctiom Converter using TMS320LF2407A, Jul. 2005.
Unitrode, Design Note DN-39E, Optimizing Performance in UC3854 Power Factor Correction Applications, Nov. 1994.
Fairchild Semiconductor, Application Note 42030, Theory and Application of the ML4821 Average Currrent Mode PFC Controller, Aug. 1997.
Fairchild Semiconductor, Application Note AN4121, Design of Power Factor Correction Circuit Using FAN7527B, Rev.1.0.1, May 30, 2002.
Fairchild Semiconductor, Application Note 6004, 500W Power-Factor-Corrected (PFC) Converter Design with FAN4810, Rev. 1.0.1, Oct. 31, 2003.
Fairchild Semiconductor, FAN4822, ZVA Average Current PFC Controller, Rev. 1.0.1 Aug. 10, 2001.
Fairchild Semiconductor, ML4821, Power Factor Controller, Rev. 1.0.2, Jun. 19, 2001.
Fairchild Semiconductor, ML4812, Power Factor Controller, Rev. 1.0.4, May 31, 2001.
Linear Technology, 100 Watt LED Driver, Linear Technology, 2006.
Fairchild Semiconductor, FAN7544, Simple Ballast Controller, Rev. 1.0.0, 2004.
Fairchild Semiconductor, FAN7532, Ballast Controller, Rev. 1.0.2, Jun. 2006.
Fairchild Semiconductor, FAN7711, Ballast Control IC, Rev. 1.0.2, Mar. 2007.
Fairchild Semiconductor, KA7541, Simple Ballast Controller, Rev. 1.0.3, 2001.
ST Microelectronics, L6574, CFL/TL Ballast Driver Preheat and Dimming, Sep. 2003.
ST Microelectronics, AN993, Application Note, Electronic Ballast with PFC Using L6574 and L6561, May 2004.
International Search Report and Written Opinion for PCT/US2008/062384 dated Jan. 14, 2008.
S. Dunlap et al., Design of Delta-Sigma Modulated Switching Power Supply, Circuits & Systems, Proceedings of the 1998 IEEE International Symposium, 1998.
Infineon, CCM-PFC Standalone Power Factor Correction (PFC) Controller in Continuous Conduction Mode (CCM), Version 2.1, Feb. 6, 2007.
International Rectifier, IRAC1150-300W Demo Board, User's Guide, Rev 3.0, Aug. 2, 2005.
International Rectifier, Application Note AN-1077,PFC Converter Design with IR1150 One Cycle Control IC, rev. 2.3, Jun. 2005.
International Rectifier, Data Sheet PD60230 revC, Feb. 5, 2007.
Lu et al., International Rectifier, Bridgeless PFC Implementation Using One Cycle Control Technique, 2005.
Linear Technology, LT1248, Power Factor Controller, Apr. 20, 2007.
On Semiconductor, AND8123/D, Power Factor Correction Stages Operating in Critical Conduction Mode, Sep. 2003.
On Semiconductor, MC33260, GreenLine Compact Power Factor Controller: Innovative Circuit for Cost Effective Solutions, Sep. 2005.
On Semiconductor, NCP1605, Enhanced, High Voltage and Efficient Standby Mode, Power Factor Controller, Feb. 2007.
On Semconductor, NCP1606, Cost Effective Power Factor Controller, Mar. 2007.
On Semiconductor, NCP1654, Product Review, Power Factor Controller for Compact and Robust, Continuous Conduction Mode Pre-Converters, Mar. 2007.
Philips, Application Note, 90W Resonant SMPS with TEA1610 SwingChip, AN99011, 1999.
NXP, TEA1750, GreenChip III SMPS control IC Product Data Sheet, Apr. 6, 2007.
Renesas, HA16174P/FP, Power Factor Correction Controller IC, Jan. 6, 2006.
Renesas Technology Releases Industry's First Critical-Conduction-Mode Power Factor Correction Control IC Implementing Interleaved Operation, Dec. 18, 2006.
Renesas, Application Note R2A20111 EVB, PFC Control IC R2A20111 Evaluation Board, Feb. 2007.
STMicroelectronics, L6563, Advanced Transition-Mode PFC Controller, Mar. 2007.
Texas Instruments, Application Note SLUA321, Startup Current Transient of the Leading Edge Triggered PFC Controllers, Jul. 2004.
Texas Instruments, Application Report, SLUA309A, Avoiding Audible Noise at Light Loads when using Leading Edge Triggered PFC Converters, Sep. 2004.
Texas Instruments, Application Report SLUA369B, 350-W, Two-Phase Interleaved PFC Pre-Regulator Design Review, Mar. 2007.
Unitrode, High Power-Factor Preregulator, Oct. 1994.
Texas Instruments, Transition Mode PFC Controller, SLUS515D, Jul. 2005.
Unitrode Products From Texas Instruments, Programmable Output Power Factor Preregulator, Dec. 2004.
Unitrode Products From Texas Instruments, High Performance Power Factor Preregulator, Oct. 2005.
Texas Instruments, UCC3817 BiCMOS Power Factor Preregulator Evaluation Board User's Guide, Nov. 2002.
Unitrode, L. Balogh, Design Note UC3854A/B and UC3855A/B Provide Power Limiting with Sinusoidal Input Current for PFC Front Ends, SLUA196A, Nov. 2001.
A. Silva De Morais et al., A High Power Factor Ballast Using a Single Switch with Both Power Stages Integrated, IEEE Transactions on Power Electronics, vol. 21, No. 2, Mar. 2006.
M. Ponce et al., High-Efficient Integrated Electronic Ballast for Compact Fluorescent Lamps, IEEE Transactions on Power Electronics, vol. 21, No. 2, Mar. 2006.
A. R. Seidel et al., A Practical Comparison Among High-Power-Factor Electronic Ballasts with Similar Ideas, IEEE Transactions on Industry Applications, vol. 41, No. 6, Nov.-Dec. 2005.
F. T. Wakabayashi et al, An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.
J. A. Vilela Jr. et al, An Electronic Ballast with High Power Factor and Low Voltage Stress, IEEE Transactions on Industry Applications, vol. 41, No. 4, Jul./Aug. 2005.
S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.
M. K. Kazimierczuk et al., Electronic Ballast for Fluorescent Lamps, IEEETransactions on Power Electronics, vol. 8, No. 4, Oct. 1993.
S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.
H. L. Cheng et al., A Novel Single-Stage High-Power-Factor Electronic Ballast with Symmetrical Topology, IEEE Transactions on Power Electronics, vol. 50, No. 4, Aug. 2003.

J.W.F. Dorleijn et al., Standardisation of the Static Resistances of Fluorescent Lamp Cathodes and New Data for Preheating, Industry Applications Conference, vol. 1, Oct. 13, 2002-Oct. 18, 2002.

Q. Li et al., An Analysis of the ZVS Two-Inductor Boost Converter under Variable Frequency Operation, IEEE Transactions on Power Electronics, vol. 22, No. 1, Jan. 2007.

H. Peng et al., Modeling of Quantization Effects in Digitally Controlled DC-DC Converters, IEEE Transactions on Power Electronics, vol. 22, No. 1, Jan. 2007.

G. Yao et al., Soft Switching Circuit for Interleaved Boost Converters, IEEE Transactions on Power Electronics, vol. 22, No. 1, Jan. 2007.

C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.

W. Zhang et al., A New Duty Cycle Control Strategy for Power Factor Correction and FPGA Implementation, IEEE Transactions on Power Electronics, vol. 21, No. 6, Nov. 2006.

H. Wu et al., Single Phase Three-Level Power Factor Correction Circuit with Passive Lossless Snubber, IEEE Transactions on Power Electronics, vol. 17, No. 2, Mar. 2006.

O. Garcia et al., High Efficiency PFC Converter to Meet EN61000-3-2 and A14, Proceedings of the 2002 IEEE International Symposium on Industrial Electronics, vol. 3, 2002.

P. Lee et al., Steady-State Analysis of an Interleaved Boost Converter with Coupled Inductors, IEEE Transactions on Industrial Electronics, vol. 47, No. 4, Aug. 2000.

D.K.W. Cheng et al., A New Improved Boost Converter with Ripple Free Input Current Using Coupled Inductors, Power Electronics and Variable Speed Drives, Sep. 21-23, 1998.

B.A. Miwa et al., High Efficiency Power Factor Correction Using Interleaved Techniques, Applied Power Electronics Conference and Exposition, Seventh Annual Conference Proceedings, Feb. 23-27, 1992.

Z. Lai et al., A Family of Power-Factor-Correction Controllers, Twelfth Annual Applied Power Electronics Conference and Exposition, vol. 1, Feb. 23, 1997-Feb. 27, 1997.

L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7, 1993-Mar. 11, 1993.

Fairchild Semiconductor, Application Note 42030, Theory and Application of the ML4821 Average Current Mode PFC Controller, Oct. 25, 2000.

Unitrode Products From Texas Instruments, BiCMOS Power Factor Preregulator, Feb. 2006.

"HV9931 Unity Power Factor LED Lamp river, Initial Release" 2005, Supertex Inc., Sunnyvale, CA USA.

An-H52 Application Note: "HV9931 Unity Power Factor LED Lamp Driver" Mar. 7, 2007, Supertex Inc., Sunnyvale, CA USA.

Dustin Rand et al: "Issues, Models and Solutions for Triac Modulated Phase Dimming of LED Lamps" Power Electronics Specialists Conference, 2007. PESC 2007, IEEE, IEEE, P1, Jun. 1, 2007, pp. 1398-1404.

Spiazzi G et al: "Analysis of a High-Power-Factor Electronic Ballast for High Brightness Light Emitting Diodes" Power Electronics Specialists, 2005 IEEE 36TH Conference on Jun. 12, 2005, Piscatawa, NJ USA, IEEE, Jun. 12, 2005, pp. 1.

International Search Report PCT/US2008/062381 dates Feb. 5, 2008.

Written Opinion of the International Searching Authority PCT/US2008/062381 dated Feb. 5, 2008.

Ben-Yaakov et al, "The Dynamics of a PWM Boost Converter with Resistive Input" IEEE Transactions on Industrial Electronics, IEEE Service Center, Piscataway, NJ, USA, vol. 4, No. 3, Jun. 1, 1999.

International Search Report PCT/US2008/062398 dated Feb. 5, 2008.

Partial International Search Report PCT/US2008/062387 dated Feb. 5, 2008.

Noon, Jim "UC3855A/B High Performance Power Factor Preregulator", Texas Instruments, SLUA146A, May 1996, Revised Apr. 2004.

"High Performance Power Factor Preregulator", Unitrode Products from Texas Instruments, SLUS382B, Jun. 1998, Revised Oct. 2005.

International Search Report PCT/GB20006/003259 dated Jan. 12, 2007.

Written Opinion of the International Searching Authority PCT/US2008/056739.

International Search Report PCT/US2008/056606 dated Dec. 3, 2008.

Written Opinion of the International Searching Authority PCT/US2008/056606 dated Dec. 3, 2008.

International Search Report PCT/US2008/056608 dated Dec. 3, 2008.

Written Opinion of the International Searching Authority PCT/US2008/056608 dated Dec. 3, 2008.

International Search Report PCT/GB2005/050228 dated Mar. 14, 2006.

International Search Report PCT/US2008/062387 dated Jan. 10, 2008.

Data Sheet LT3496 Triple Output LED Driver, 2007, Linear Technology Corporation, Milpitas, CA.

News Release, Triple Output LED, LT3496.

Power Integrations, Inc., "TOP200-4/14 TOPSwitch Family Three-terminal Off-line PWM Switch", XP-002524650, Jul. 1996, Sunnyvale, California.

Texas Instruments, SLOS318F, "High-Speed, Low Noise, Fully-Differential I/O Amplifiers," THS4130 and THS4131, US, Jan. 2006.

International Search Report and Written Opinion, PCT US20080062387, dated Feb. 5, 2008.

International Search Report and Written Opinion, PCT US200900032358, dated Jan. 29, 2009.

Hirota, Atsushi et al, "Analysis of Single Switch Delta-Sigma Modulated Pulse Space Modulation PFC Converter Effectively Using Switching Power Device," IEEE, US, 2002.

Prodic, Aleksandar, "Digital Controller for High-Frequency Rectifiers with Power Factor Correction Suitable for On-Chip Implementation," IEEE, US, 2007.

International Search Report and Written Opinion, PCT US20080062378, dated Feb. 5, 2008.

International Search Report and Written Opinion, PCT US20090032351, dated Jan. 29, 2009.

Erickson, Robert W. et al, "Fundamentals of Power Electronics," Second Edition, Chapter 6, Boulder, CO, 2001.

Allegro Microsystems, A1442, "Low Voltage Full Bridge Brushless DC Motor Driver with Hall Commutation and Soft-Switching, and Reverse Battery, Short Circuit, and Thermal Shutdown Protection," Worcester MA, 2009.

Texas Instruments, SLUS828B, "8-Pin Continuous Conduction Mode (CCM) PFC Controller", UCC28019A, US, revised Apr. 2009.

Analog Devices, "120 kHz Bandwidth, Low Distortion, Isolation Amplifier", AD215, Norwood, MA, 1996.

Burr-Brown, ISO120 and ISO121, "Precision Los Cost Isolation Amplifier," Tucson AZ, Mar. 1992.

Burr-Brown, ISO130, "High IMR, Low Cost Isolation Amplifier," SBOS220, US, Oct. 2001.

International Search Report and Written Report PCT US20080062428 dated Feb. 5, 2008.

Prodic, A. et al, "Dead Zone Digital Controller for Improved Dynamic Response of Power Factor Preregulators," IEEE, 2003.

"HV9931 Unity Power Factor LED Lamp Driver, Initial Release", Supertex Inc., Sunnyvale, CA USA 2005.

"AN-H52 Application Note: HV9931 Unity Power Factor LED Lamp Driver" Mar. 7, 2007, Supertex Inc., Sunnyvale, CA, USA.

Dustin Rand et al: "Issues, Models and Solutions for Triac Modulated Phase Dimming of LED Lamps" Power Electronics Specialists Conferrence, 2007. PESC 2007. IEEE, IEEE, P1, Jun. 1, 2007, pp. 1398-1404.

Spiazzi G et al: "Analysis of a High-Power Factor Electronic Ballast for High Brightness Light Emitting Diodes" Power Electronics Specialists, 2005 IEEE 36TH Conference on Jun. 12, 2005, Piscatawa, NJ, USA, IEEE, Jun. 12, 2005, pp. 1494-1499.

International Search Report PCT/US2008/062381 dated Feb. 5, 2008.

International Search Report PCT/US2008/056739 dated Dec. 3, 2008.

Written Opinion of the International Searching Authority PCT/US2008/062381 dated Feb. 5, 2008.
Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.
Noon, Jim "UC3855A/B High Performance Power Factor Preregulator", Texas Instruments, SLUA146A, May 1996, Revised Apr. 2004.
International Search Report PCT/GB2006/003259 dated Jan. 12, 2007.
Written Opinion of the International Searching Authority PCT/US2008/056739 dated Dec. 3, 2008.
Data Sheet LT3496 Triple Output LED Driver, Linear Technology Corporation, Milpitas, CA 2007.
Linear Technology, News Release,Triple Output LED, LT3496, Linear Technology, Milpitas, CA, May 24, 2007.
Freescale Semiconductor, Inc., Dimmable Light Ballast with Power Factor Correction, Design Reference Manual, DRM067, Rev. 1, Dec. 2005.
J. Zhou et al., Novel Sampling Algorithm for DSP Controlled 2 kW PFC Converter, IEEE Transactions on Power Electronics, vol. 16, No. 2, Mar. 2001.
A. Prodic, Compensator Design and Stability Assessment for Fast Voltage Loops of Power Factor Correction Rectifiers, IEEE Transactions on Power Electronics, vol. 22, No. 5, Sep. 2007.
M. Brkovic et al., "Automatic Current Shaper with Fast Output Regulation and Soft-Switching," S.15.C Power Converters, Telecommunications Energy Conference, 1993.
Dallas Semiconductor, Maxim, "Charge-Pump and Step-Up DC-DC Converter Solutions for Powering White LEDs in Series or Parallel Connections," Apr. 23, 2002.
Freescale Semiconductor, AN3052, Implementing PFC Average Current Mode Control Using the MC9S12E128, Nov. 2005.
D. Maksimovic et al., "Switching Converters with Wide DC Conversion Range," Institute of Electrical and Electronic Engineer's (IEEE) Transactions on Power Electronics, Jan. 1991.
V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue , Jun. 18-22, 1995 pp. 1086-1093.
S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.
K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue , May 25-28, 2003 pp. III-439-III-442 vol. 3.
K. Leung et al., "Dynamic Hysteresis Band Control of the Buck Converter with Fast Transient Response," IEEE Transactions on Circuits and Systems—II: Express Briefs, vol. 52, No. 7, Jul. 2005.
Y. Ohno, Spectral Design Considerations for White LED Color Rendering, Final Manuscript, Optical Engineering, vol. 44, 111302 (2005).
S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.
J. Turchi, Four Key Steps to Design a Continuous Conduction Mode PFC Stage Using the NCP1653, on Semiconductor, Publication Order No. AND184/D, Nov. 2004.
Megaman, D or S Dimming ESL, Product News, Mar. 15, 2007.
J. Qian et al., New Charge Pump Power-Factor-Correction Electronic Ballast with a Wide Range of Line Input Voltage, IEEE Transactions on Power Electronics, vol. 14, No. 1, Jan. 1999.
P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.
J. Qian et al., Charge Pump Power-Factor-Correction Technologies Part II: Ballast Applications, IEEE Transactions on Power Electronics, vol. 15, No. 1, Jan. 2000.

Chromacity Shifts in High-Power White LED Systems due to Different Dimming Methods, Solid-State Lighting, http://www.lrc.rpi.edu/programs/solidstate/completedProjects.asp?ID=76, printed May 3, 2007.
S. Chan et al., Design and Implementation of Dimmable Electronic Ballast Based on Integrated Inductor, IEEE Transactions on Power Electronics, vol. 22, No. 1, Jan. 2007.
M. Madigan et al., Integrated High-Quality Rectifier-Regulators, IEEE Transactions on Industrial Electronics, vol. 46, No. 4, Aug. 1999.
T. Wu et al., Single-Stage Electronic Ballast with Dimming Feature and Unity Power Factor, IEEE Transactions on Power Electronics, vol. 13, No. 3, May 1998.
F. Tao et al., "Single-Stage Power-Factor-Correction Electronic Ballast with a Wide Continuous Dimming Control for Fluorescent Lamps," IEEE Power Electronics Specialists Conference, vol. 2, 2001.
Azoteq, IQS17 Family, IQ Switch®—ProxSense™ Series, Touch Sensor, Load Control and User Interface, IQS17 Datasheet V2.00.doc, Jan. 2007.
C. Dilouie, Introducing the LED Driver, EC&M, Sep. 2004.
S. Lee et al., TRIAC Dimmable Ballast with Power Equalization, IEEE Transactions on Power Electronics, vol. 20, No. 6, Nov. 2005.
L. Gonthier et al., EN55015 Compliant 500W Dimmer with Low-Losses Symmetrical Switches, 2005 European Conference on Power Electronics and Applications, Sep. 2005.
Why Different Dimming Ranges? The Difference Between Measured and Perceived Light, 2000 http://www.lutron.com/ballast/pdf/LutronBallastpg3.pdf.
D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.
Light Dimmer Circuits, www.epanorama.net/documents/lights/lightdimmer.html, printed Mar. 26, 2007.
Light Emitting Diode, http://en.wikipedia.org/wiki/Light-emitting_diode, printed Mar. 27, 2007.
Color Temperature, www.sizes.com/units/color_temperature.htm, printed Mar. 27, 2007.
S. Lee et al., A Novel Electrode Power Profiler for Dimmable Ballasts Using DC Link Voltage and Switching Frequency Controls, IEEE Transactions on Power Electronics, vol. 19, No. 3, May 2004.
Y. Ji et al., Compatibility Testing of Fluorescent Lamp and Ballast Systems, IEEE Transactions on Industry Applications, vol. 35, No. 6, Nov./Dec. 1999.
National Lighting Product Information Program, Specifier Reports, "Dimming Electronic Ballasts," vol. 7, No. 3, Oct. 1999.
Supertex Inc., Buck-based LED Drivers Using the HV9910B, Application Note AN-H48, Dec. 28, 2007.
D. Rand et al., Issues, Models and Solutions for Triac Modulated Phase Dimming of LED Lamps, Power Electronics Specialists Conference, 2007.
Supertex Inc., HV9931 Unity Power Factor LED Lamp Driver, Application Note AN-H52, Mar. 7, 2007.
Supertex Inc., 56W Off-line LED Driver, 120VAC with PFC, 160V, 350mA Load, Dimmer Switch Compatible, DN-H05, Feb. 2007.
ST Microelectronics, Power Factor Corrector L6561, Jun. 2004.
Fairchild Semiconductor, Application Note 42047 Power Factor Correction (PFC) Basics, Rev. 0.9.0 Aug. 19, 2004.
M. Radecker et al., Application of Single-Transistor Smart-Power IC for Fluorescent Lamp Ballast, Thirty-Fourth Annual Industry Applications Conference IEEE, vol. 1, Oct. 3, 1999-Oct. 7, 1999.
M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.
Fairchild Semiconductor, FAN4800, Low Start-up Current PFC/PWM Controller Combos, Nov. 2006.
Fairchild Semiconductor, FAN4810, Power Factor Correction Controller, Sep. 24, 2003.
Fairchild Semiconductor, FAN4822, ZVS Average Current PFC Controller, Aug. 10, 2001.

Fairchild Semiconductor, FAN7527B, Power Factor Correction Controller, 2003.
Fairchild Semiconductor, ML4821, Power Factor Controller, Jun. 19, 2001.
Freescale Semiconductor, AN1965, Design of Indirect Power Factor Correction Using 56F800/E, Jul. 2005.
International Search Report for PCT/US2008/051072, Attorney Ref. 1660-CA-PCT, mailed Jun. 4, 2008.
Linear Technology, "Single Switch PWM Controller with Auxiliary Boost Converter," LT1950 Datasheet, Linear Technology, Inc. Milpitas, CA, 2003.
Yu, Zhenyu, 3.3V DSP for Digital Motor Control, Texas Instruments, Application Report SPRA550 dated Jun. 1999.
International Rectifier, Data Sheet No. PD60143-O, Current Sensing Single Channel Driver, El Segundo, CA, dated Sep. 8, 2004.
Balogh, Laszlo, "Design and Application Guide for High Speed MOSFET Gate Drive Circuits" [Online] 2001, Texas Instruments, Inc., SEM-1400, Unitrode Power Supply Design Seminar, Topic II, TI literature No. SLUP133, XP002552367, Retrieved from the Internet: URL:htt/:///focus.ti.com/lit/ml/slup169/slup169.pdf the whole document.
ST Datasheet L6562, Transition-Mode PFC Controller, 2005, STMicroelectronics, Geneva, Switzerland.
Maksimovic, Regan Zane and Robert Erickson, Impact of Digital Control in Power Electronics, Proceedings of 2004 International Symposium on Power Semiconductor Devices & Ics, Kitakyushu, , Apr. 5, 2010, Colorado Power Electronics Center, ECE Department, University of Colorado, Boulder, CO.

* cited by examiner

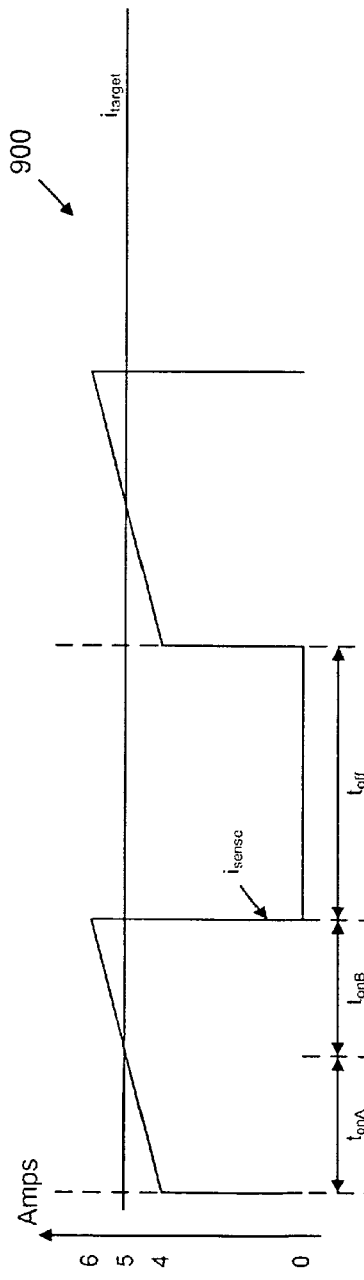
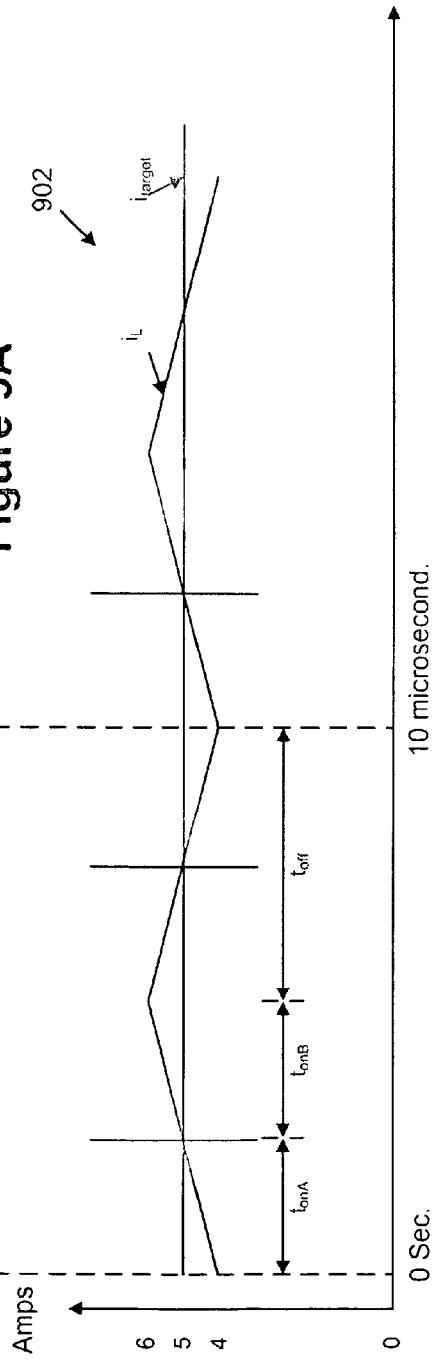
Figure 9A
Figure 9B pfc sim ccm only.nb

In[1]:= (* Emulation of boost CCM PFC
    John Melanson
    Copyright Cirrus Logic The PFC control uses trailing edge control,
    with a current comparison to a reference.
      The reference is preferably update once per switching cycle.
      The reference is the desired average current.
      In this simulation, the average target is a product
      of a control function and the instantaneous line voltage.
    *)

FIGURE 14A

*pfc sim ccm only.nb*    2

```
In[2]:=  (* sample rate.  In a real system, a faster clock is anticipated, maybe 10-20 MHz *)
         fs = 5. 10^6; ts = 1. / fs;
         (*       simulation length, fs samples       *)
         len = 2^19;
         win = .5 (1. - Cos[2. Pi * Range[len] / len]);
         freqax = Range[len / 2] / len * fs;
         Print["total simulated time = ", len * ts, " seconds"];

total simulated time = 0.104858 seconds

In[7]:=  widespect[x_, fs_] := (* Plot the broadband spectrum, averaged*)
            Module[{pow = Table[0, {513}], num, X, win, fax, sc},
              win = .5 (1 - Cos[Range[1024] (2. Pi / 1024)]);
              fax = Range[0, 512] / 1024. * fs;
              num = Floor[Length[x] / 512] - 1;
              Do[X = Take[Fourier[Take[x, {1, 1024} + i * 512] * win], 513];
                pow += Re[X]^2 + Im[X]^2;
                , {i, 0, num - 1}];
              sc = 1 / Total[Take[pow, 5]];
              pow = 10 Log[10, sc * pow];
              ListPlot[Transpose[{fax, pow}],
               PlotRange -> {All, {-80, -20}},
               PlotJoined -> True, GridLines -> Automatic, ImageSize -> 72 * 6];
             ];
         lowspect[x_, fs_, ftop_] := (* plot the low frequency spectrum for line harmonics *)
            Module[{X, bins},
              bins = Floor[Length[x] * ftop / fs + 1];
              X = Take[Fourier[win * x], bins];
              X = Re[X]^2 + Im[X]^2; X = X / Total[X];
              ListPlot[10 Log[10, X], PlotRange -> All, PlotJoined -> True, GridLines -> Automatic];
             ];

In[9]:=  (*       PFC simulation        *)
         runjlmpfc[vin_, fin_, initcap_] := Module[
             {w1 = 2. Pi fin / fs,     (* for calculating sine input *)
              sw,                       (* True when stich is closed *)
              ontime,                   (* Time at which switch was closed *)
              il,                       (* inductor current *)
              state = {},               (* save for analysis of pfc actions *)
              timer = 0,                (* when to next do something *)
              vpk, nswitch, kl, fber, vline,
              vcl = initcap,            (* link voltage *)
              pw = 0, pws = {}, dsl = 0, temp,
             },
             sw = False; ontime = 0.; il = 0.; vpk = vin Sqrt[2.];
             nswitch = 0; kl = 1. / (vin * vin); fber = 0.; vline = 0.;
             Do[

(*
                update "spice" part.  Calulates new currents and voltages,
                trapaziodal aproximation
```

FIGURE 14B

```
        This part only simulates (mathematicaly) the behavior
        of the analog power components
    *)
vx = Abs[vline];
oldil = il; il = Max[0, il + If[sw, vx ts / L1, (vx - vcl) ts / L1]];
(* max takes care of diode function for dcm mode *)
vcl += ts / C1 * (If[sw, 0, .5 (il + oldil)] - pout[[t]] / vcl);

(*
This is the voltage regulation (slow) loop
    Updated synchronously with the line
    look for 0 crossing to update outer fb loop. PI controller *)

oldvline = vline; vline = vpk Sin[w1 t];
If[oldvline * vline < 0,
    oldfber = fber; fber = vtarget - vcl;
    pin = pin + 20 (fber - .75 oldfber);
    If[False, Print["voltage error = ", fber, "  control signal = ", pin]];
    ontime = t;
];

(*
This is the fast loop, which regulates
    current.  The loop operates only on feedback from one comparator.

Simulate switch control
*)

If[sw,
    (* If the switch is on,
    timer <0 indicates that the current comparator has not tripped yet *)
    If[timer < 0,
        (* Calculate timer when current limit hit *)
        If[il > itrig, temp = (pw + (t - ontime)) / 2 + ds1;
            pw = Floor[temp]; ds1 = temp - pw; pws = {pws, pw}; timer = t + pw;];
        ,
        (* Look for end of on period.  Timer is now when to shut off *)
        If[(t ≥ timer),
            sw = False;
            toff = nomt2;
            If[vx > vtarget / 4, toff = nomt2 * (.5 + 2 * vx / vtarget)];
            If[vx > vtarget / 2, toff = nomt2 * (4 * vx / vtarget - .5)];
            timer = t + toff;
        ];
    ];
    ,
    (* Look for off to on transition.  Timer
    is time for turn on when switch is off (False) *)
    If[t ≥ timer,
        sw = True; timer = -1; ontime = t;
        (* Calculate new trigger current *)
```

FIGURE 14C

*pfc-sim ccm only.nb*  4

```
            itrig = vx * kl * pin; nswitch++;
          };
        ];

(*
          record state of switch,
          inductor current, line voltage, pfc output voltage in state
            This is not part of the algorithm, only for instrumenting the test  *)
          state = {state, If[sw, 1, 0], il, vline, vc1};
          , {t, len}];
        state = Transpose[Partition[Flatten[state], 4]];
        If[False, ListPlot[Take[Flatten[pws], 1000]]];
        favg = nswitch / len * fs; Print["Average swith rate= ", favg];
        state];

In[101]:= (* Run simulation, look at waveshapes, specturms
          120 V input
          *)
        pout = Table[400., {len}];
        vtarget = 400.;
        L1 = 500. 10^-6; C1 = 400. 10^-6;
        nomt2 = 25; pin = pout[[1]];
        out1 = runjlmpfc[120., 60., vtarget];
        linei = out1[[2]] * Sign[out1[[3]]];
        segwave = ({1, 41000, 8});
        ListPlot[Take[linei, segwave], PlotJoined -> True, PlotRange -> All];
        ListPlot[Take[out1[[3]], segwave], PlotJoined -> True, PlotRange -> All];
        seg1 = ({1, 2000} + 19500);
        ListPlot[Take[linei, seg1], PlotJoined -> True, PlotRange -> All];
        ListPlot[Take[out1[[3]], seg1], PlotJoined -> True, PlotRange -> All];
        seg2 = ({1, 4000} + 39000);
        ListPlot[Take[linei, seg2], PlotJoined -> True, PlotRange -> All];
        ListPlot[Take[out1[[3]], seg2], PlotJoined -> True, PlotRange -> All];
        widespect[linei, fs]; lowspect[linei, fs, 1000];
        ListPlot[Take[out1[[4]], {1, len - 255, 256}], PlotRange -> All, PlotJoined -> True];

Average swith rate= 48770.9
```

FIGURE 14D pfc sim ccm only.nb 8

```
In[27]:= (* Run simulation, look at waveshapes, specturms
        240 V input
        *)
      pout = Table[400., {len}];
      vtarget = 400.;
      L1 = 500. 10^-6; C1 = 400. 10^-6;
      nomt2 = 20; pin = pout[[1]];
      out1 = runjlmpfc[240., 60., vtarget];
      linei = out1[[2]] * Sign[out1[[3]]];
      segwave = ({1, 41000, 8});
      ListPlot[Take[linei, segwave], PlotJoined -> True, PlotRange -> All];
      ListPlot[Take[out1[[3]], segwave], PlotJoined -> True, PlotRange -> All];
      seg1 = ({1, 2000} + 19500);
      ListPlot[Take[linei, seg1], PlotJoined -> True, PlotRange -> All];
      ListPlot[Take[out1[[3]], seg1], PlotJoined -> True, PlotRange -> All];
      seg2 = ({1, 4000} + 39000);
      ListPlot[Take[linei, seg2], PlotJoined -> True, PlotRange -> All];
      ListPlot[Take[out1[[3]], seg2], PlotJoined -> True, PlotRange -> All];
      widespect[linei, fs]; lowspect[linei, fs, 1000];
      ListPlot[Take[out1[[4]], {1, len - 255, 256}], PlotRange -> All, PlotJoined -> True];
```

Average switch rate 79965.6

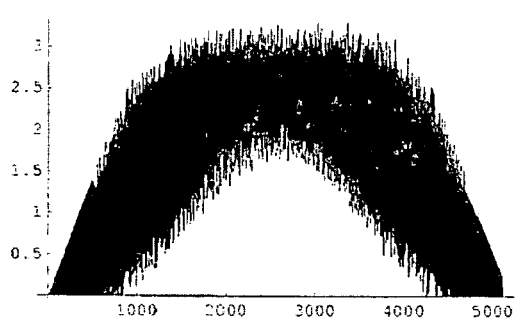

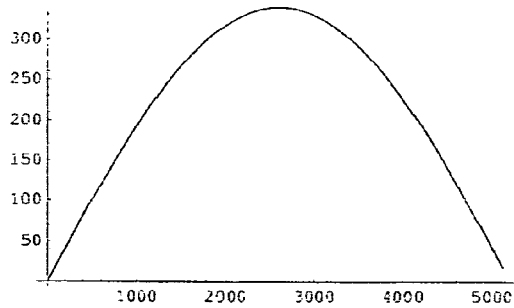

FIGURE 14H pfc sim ccm only.nb

*pfc sim 1.nb*

```
In[1]:= (* Emulation of boost CCM PFC
        John Melanson
        Copyright Cirrus Logic The PFC control uses trailing edge control,
    with a current comparison to a reference.
        The reference is preferably update once per switching cycle.
        The reference is calcuated from two function,
    the first of which follows the desired average current,
    and the second which follows the desired ripple current.
        In this simulation, the average target is a product
        of a control function and the instantaneous line voltage.
        The ripple target is calulated for a constant off
        time.  This gives spectrum spreading.
    *)
```

FIGURE 15A pfc_sim_1.nb                                                                                                                    2

```
In[2]:=  (*sample rate*) fs = 1. 10^6; ts = 1. / fs;
         (* simulation length*) len = 2^18; win = .5 (1. - Cos[2. Pi * Range[len] / len]);
         freqax = Range[len / 2] / len * fs;
         Print["total simulated time = ", len * ts, " seconds"];

total simulated time = 0.262144 seconds

In[6]:=  widespect[x_, fs_] := (* Plot the broadband spectrum, averaged*)
           Module[{pow = Table[0, {513}], num, X, win, fax, sc},
             win = .5 (1 - Cos[Range[1024] (2. Pi / 1024)]);
             fax = Range[0, 512] / 1024. * fs;
             num = Floor[Length[x] / 512] - 1;
             Do[X = Take[Fourier[Take[x, {1, 1024} + i * 512] * win], 513];
               pow += Re[X]^2 + Im[X]^2;
               , {i, 0, num - 1}];
             sc = 1 / Total[Take[pow, 5]];
             pow = 10 Log[10, sc * pow];
             ListPlot[Transpose[{fax, pow}],
               PlotRange → {All, {-80, -20}},
               PlotJoined → True, GridLines → Automatic, ImageSize → 72 * 6];
           ];
         lowspect[x_, fs_, ftop_] := (* plot the low frequency spectrum for line harmonics *)
           Module[{X, bins},
             bins = Floor[Length[x] * ftop / fs + 1];
             X = Take[Fourier[win * x], bins];
             X = Re[X]^2 + Im[X]^2; X = X / Total[X];
             ListPlot[10 Log[10, X], PlotRange → All, PlotJoined → True, GridLines → Automatic];
           ];
```

FIGURE 15B

*pfc sim 1.nb*  3

```
In[9]:= (* Run the simulation *)
    runjlmpfc[vin_, fin_, initcap_] := Module[
      {w1 = 2. Pi fin / fs, sw, ontime, il, state = {},
       timer = 0, vpk, nswitch, k1, k2, fber, vline, vc1 = initcap},
      sw = False; ontime = 0.; il = 0.; vpk = vin Sqrt[2.];
      nswitch = 0; k1 = Sqrt[2.] / vin; k2 = ts * nomt2 / (2 L1); fber = 0.; vline = 0.;
      Do[

(* update "spice" part. Calulates new currents and voltages,
         trapaziodal aproximation *)
        vx = Abs[vline];
        oldil = il; il = Max[0, il + If[sw, vx ts / L1, (vx - vc1) ts / L1]];
        vc1 += ts / C1 * (If[sw, 0, .5 (il + oldil)] - pout[[t]] / vc1);

(* look for 0 crossing to update outer fb loop *)

oldvline = vline; vline = vpk Sin[w1 t];
        If[oldvline * vline < 0,
         oldfber = fber; fber = vtarget - vc1;
         pin = pin + 10 (fber - .75 oldfber);
         If[False, Print["voltage error = ", fber, "  control signal = ", pin]];
        ];

(* simulate switch control *)

If[sw,
         (* look for on to off transition on current limit hit *)
         If[(il > itrig), sw = False; timer = t + nomt2;];

(* Look for off to on transition *)
         If[t ≥ timer,
           sw = True; sinpos = Abs[Sin[w1 ( t + 10)]];
           (* Calculate new trigger current *)
           itrig = sinpos * k1 * pin; itrig += Min[k2 (vtarget - vpk sinpos), itrig]; nswitch++;]
        ];

(* record state of switch, inductor current, line voltage, pfc output voltage *)
        state = {state, If[sw, 1, 0], il, vline, vc1};
       , {t, len}];
      state = Transpose[Partition[Flatten[state], 4]];
      tavg = nswitch / len * fs; Print["average switch freq = ", favg];
      state];
```

FIGURE 15C

*pfc sim 1.nb*

```
In[2]:= (* Run simulation, look at waveshapes, specturms*)
        pout = Table[300., {len}];
        vtarget = 400.;
        L1 = 1000. 10^-6; C1 = 400. 10^-6;
        nomt2 = 10; pin = pout[[1]] - 2;
        out1 = runjlmpfc[120., 60., vtarget];
        linei = out1[[2]] * Sign[out1[[3]]];
        seg = {1, 300} + 3900;
        ListPlot[Take[linei, seg], PlotJoined -> True, PlotRange -> All];
        ListPlot[Take[out1[[3]], seg], PlotJoined -> True, PlotRange -> All];
        seg = {1, 300} + 8000;
        ListPlot[Take[linei, seg], PlotJoined -> True, PlotRange -> All];
        ListPlot[Take[out1[[3]], seg], PlotJoined -> True, PlotRange -> All];
        widespect[linei, fs]; lowspect[linei, fs, 1000];
        ListPlot[Take[out1[[4]], {1, len - 255, 256}], PlotRange -> All, PlotJoined -> True];

average switch freq = 29861.5
```

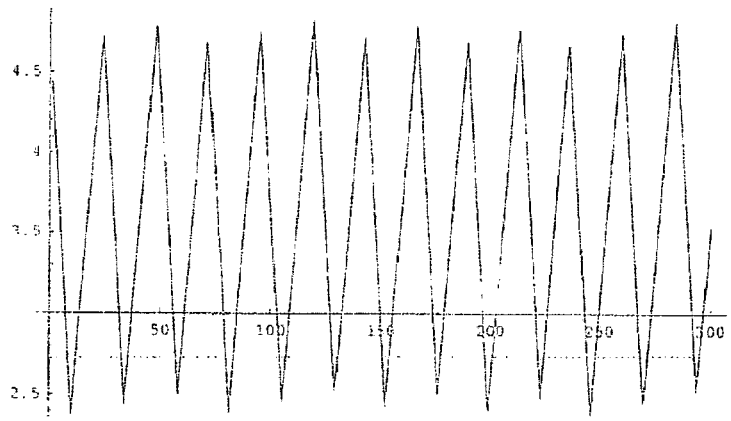

POWER FACTOR CORRECTION (PFC) CONTROLLER AND METHOD USING A FINITE STATE MACHINE TO ADJUST THE DUTY CYCLE OF A PWM CONTROL SIGNAL

CROSS-REFERENCE TO RELATED APPLICATIONS

This application claims the benefit under 35 U.S.C. §119(e) and 37 C.F.R §1.78 of U.S. Provisional Application No. 60/915,547, filed May 2, 2007, and entitled "Power Factor Correction (PFC) Controller Apparatuses and Methods," and is incorporated by reference in its entirety.

BACKGROUND OF THE INVENTION

1. Field of the Invention

The present invention relates in general to the field of signal processing, and, more specifically, to a power factor correction (PFC) controller and method using a finite state machine to adjust the duty cycle of a pulse width modulation (PWM) switching control signal.

2. Description of the Related Art

Power factor correctors often utilize u switch-mode boost stage to convert alternating current (AC) voltages (such as line/mains voltages) to direct current (DC) voltages or DC-to-DC wherein the input current is proportional to the input voltage. Power factor correctors provide power factor corrected (PFC) and regulated output voltages to many devices that utilize a regulated output voltage.

FIG. 1 represents a typical exemplary power factor corrector 100, which includes a switch-mode boost stage 102. Voltage source 101 supplies an alternating current (AC) input voltage $V_{in}(t)$ to a full-wave diode bridge rectifier 103. The voltage source 101 (e.g., voltage $V_{in}(t)$) is, for example, a public utility, such as a 60 Hz/120 V line (mains) voltage in the United States of America or a 50 Hz/230 V line (mains) voltage in Europe. The input rate associated with input voltage $V_{in}(t)$ is the frequency of voltage source 101 (e.g., 60 Hz in the U.S. and 50 Hz. in Europe). The rectifier 103 rectifies the input voltage $V_{in}(t)$ and supplies a rectified, time-varying, line input voltage $V_x(t)$ to the switch-mode boost stage 102. The actual voltage at any time t is referred to as the instantaneous input voltage. Unless otherwise stated, the term "line rate" is hereafter referred to and defined as the rectified input frequency associated with the rectified line voltage $V_x(t)$. The line rate is also equal to twice the input frequency associated with input voltage $V_{in}(t)$. The rectified line input voltage is measured and provided in terms of Root Mean Square (RMS) voltage, e.g., $V_{rms}$.

The switch-mode boost stage 102 includes a switch 108 (e.g., Field Effect Transistor (FET)) by which it is controlled and provides power factor correction (PFC) in accordance with how switch 108 is controlled. The switch-mode boost stage 102 is also controlled by switch 108 and regulates the transfer of energy from the rectified line input voltage $V_x(t)$ through inductor 110 to capacitor 106 via a diode 111. The inductor current $i_L$ ramps 'up' when the switch 108 conducts, i.e. is "ON". The inductor current $i_L$ ramps down when switch 108 is nonconductive, i.e. is "OFF", and supplies current $i_L$ recharge capacitor 106. The time period during which inductor current $i_L$ ramps down is commonly referred to as the "inductor flyback time". A sense resistor 109 is utilized effectively in series with inductor 110.

Power factor correction (PFC) controller 114 of power factor corrector 100 controls switch 108 and, thus, controls power factor correction and regulates output power of the switch-mode boost stage 102. The goal of power factor correction technology is to make the switch-mode boost stage 102 appear resistive to the voltage source 101. Thus, the PFC controller 114 attempts to control the inductor current $i_L$ so that the average inductor current $i_L$ is proportionate to the rectified line input voltage $V_x(t)$. Unitrode Products Datasheet entitled "*UCC2817, UCC2818, UCC3817, UCC3818 BiCMOS Power Factor Preregulator*" (SLUS3951) dated February 2000—Revised February 2006 by Texas Instruments Incorporated. Copyright 2006-2007 (referred to herein as "Unitrode datasheet") and International Rectifier Datasheet entitled "*Datasheet No. PD60230 rev CIR1150(S(PbF) and IR 11501(S)(PbF)*" dated Feb. 5, 2007 by International Rectifier, describe examples of PFC controller 114. The PFC 114 supplies a pulse width modulated (PWM) control signal $CS_0$ to control the conductivity of switch 108.

Two modes of switching stage operation exist: Discontinuous Conduction Mode ("DCM") and Continuous Conduction Mode ("CCM"). In DCM, switch 108 of PFC controller 114 (or boost converter) is turned on (e.g., "ON") when the inductor current $i_L$ equals zero. In CCM, switch 108 of PFC controller 114 (or boost converter) switches "ON" when the inductor current is non-zero, and the current in the energy transfer inductor 110 never reaches zero during the switching cycle. In CCM, the current swing is less than in DCM, which results in lower $I^2R$ power losses and lower ripple current for inductor current $i_L$ which results in lower inductor core losses. The lower voltage swing also reduces Electro Magnetic Interference (EMI), and a smaller input filter can then be used. Since switch 108 is turned "OFF" when the inductor current $i_L$ is not equal to zero, diode 111 needs to be very fast in terms of reverse recovery in order to minimize losses.

The switching rate for switch 108 is typically operated in the range of 20 kHz to 100 kHz. Slower switching frequencies are avoided in order to avoid the human audio frequency range as well as avoid increasing the size of inductor 110. Faster switching frequencies are typically avoided since they increase the switching losses and are more difficult to use in terms of meeting Radio Frequency Interference (RFI) standards.

Capacitor 106 supplies stored energy to load 112. The capacitor 106 is sufficiently large so as to maintain a substantially constant link output voltage $V_c(t)$ through the cycle of the line rate. The link output voltage $V_c(t)$ remains substantially constant during constant load conditions. However, as load conditions change, the link output voltage $V_c(t)$ changes. The PFC controller 114 responds to the changes in link output voltage $V_c(t)$ and adjusts the control signal $CS_0$ to resume a substantially constant output voltage as quickly as possible. The PFC controller 114 includes a small capacitor 115 to prevent any high frequency switching signals from coupling to the line (mains) input voltage $V_{in}(t)$.

PFC controller 114 receives two feedback signals, the rectified line input voltage $V_x(t)$ and the link output voltage $V_c(t)$, via a wide bandwidth current loop 116 and a slower voltage loop 118. The rectified line input voltage $V_x(t)$ is sensed from node 120 between the diode rectifier 103 and inductor 110. The link output voltage $V_c(t)$ is sensed from node 122 between diode 111 and load 112. The current loop 116 operates at a frequency $f_c$ that is sufficient to allow the PFC controller 114 to respond to changes in the rectified line input voltage $V_x(t)$ and cause the inductor current $i_L$ to track the rectified line input voltage $V_x(t)$ to provide power factor correction. The inductor current $i_L$ controlled by the current loop 116 has a control bandwidth of 5 kHz to 10 kHz. The voltage loop 118 operates at a much slower frequency control bandwidth of about 5 Hz to 20 Hz. By operating at 5 Hz to 20 Hz, the voltage loop 118 functions as a low pass filter to filter a harmonic ripple component of the link output voltage $V_c(t)$.

A number of external components which are outside of PFC controller 114 for respective power factor corrector 100 are still required. For example, a power factor corrector 100 may typically comprise of two Proportional-Integral (PI) controllers, one PI controller associated with the current loop 116 and another PI controller associated with the voltage loop 118. It would be desired and would simplify the circuitry for the power factor corrector 100 if the PI controller associated with the current loop 116 could be eliminated. Furthermore, typical power factor corrector 100 does not primarily comprise of digital circuitry. Thus, it is needed and desired to have a power factor corrector which is primarily made up of digital circuitry. It is needed and desired to also minimize the number of external components outside of a PFC controller for a power factor corrector.

SUMMARY OF THE INVENTION

The present invention provides a power factor correction (PFC) controller and method using a finite state machine to adjust the duty cycle of a pulse width modulation (PWM) switching control signal.

In one embodiment of power factor correctors and corresponding methods, a power factor corrector (PFC) includes a switch-mode boost stage, a target current generator, a comparator, and a finite state machine. The switch-mode boost stage has a switch and an inductor coupled to the switch. The switch-mode boost stage receives a rectified line input voltage and provides a link output voltage. A sensed current is observed from the switch-mode boost stage. A target current generator receives the link output voltage and generates a target current proportionate to the rectified line input voltage. A comparator receives a target current value representative of the target current and a sensed current value representative of the sensed current. The comparator outputs a two-level current comparison result signal. A finite state machine responsive to the two-level current comparison result signal, generates a switch control signal that has a duty cycle which is adjusted for controlling the switch so that the sensed current is approximately proportionate to the rectified line input voltage, such that power factor correction is performed.

In another embodiment of PFCs and corresponding methods, a power factor corrector (PFC) includes a switch-mode boost stage, a target current generator, a comparator, and a finite state machine. The switch-mode boost stage has a switch and an inductor coupled to the switch. The switch-mode boost stage receives a rectified line input voltage and provides a link output voltage. A sensed current is observed from the switch-mode boost stage. A target current generator receives the link output voltage and generates a target current proportionate to the rectified line input voltage. A ripple current estimator generates a ripple current that estimates a peak-to-peak inductor ripple current. A comparator, responsive to the target current, the ripple current, and the sensed current, outputs a two-level current comparison result signal. A finite state machine responsive to the two-level current comparison result signal, generates a switch control signal that has a duty cycle which is adjusted for controlling the switch so that the sensed current is approximately proportionate to the rectified line input voltage, such that power factor correction is performed.

In each of the embodiments, the target current generator, the comparator, and the finite state machine can be taken together to make up a power factor correction (PFC) controller. The PFC controller can be implemented on a single integrated circuit, and the rectified line input voltage and the link output voltage can be correspondingly scaled for operational use by the integrated circuit.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 9A depicts exemplary current waveforms for a preferred switch control algorithm for the power factor corrector shown in FIG. 2A in which the switch current during its on-times is 50% above and 50% below the target current.

FIG. 9B depicts exemplary current waveforms for another preferred switch control algorithm for the power factor corrector shown in FIG. 2B in which the boost inductor current is 50% above and 50% below the target current.

FIGS. 14A to 14J depict Mathematica code for an exemplary implementation of the functions of the switch control algorithm as depicted by FIGS. 9A, 9B, and 10.

FIGS. 15A to 15J depict Mathematics code for an exemplary implementation of the functions of the switch control technique algorithm as depicted by FIGS. 11 and 12.

DETAILED DESCRIPTION

Figure 1:
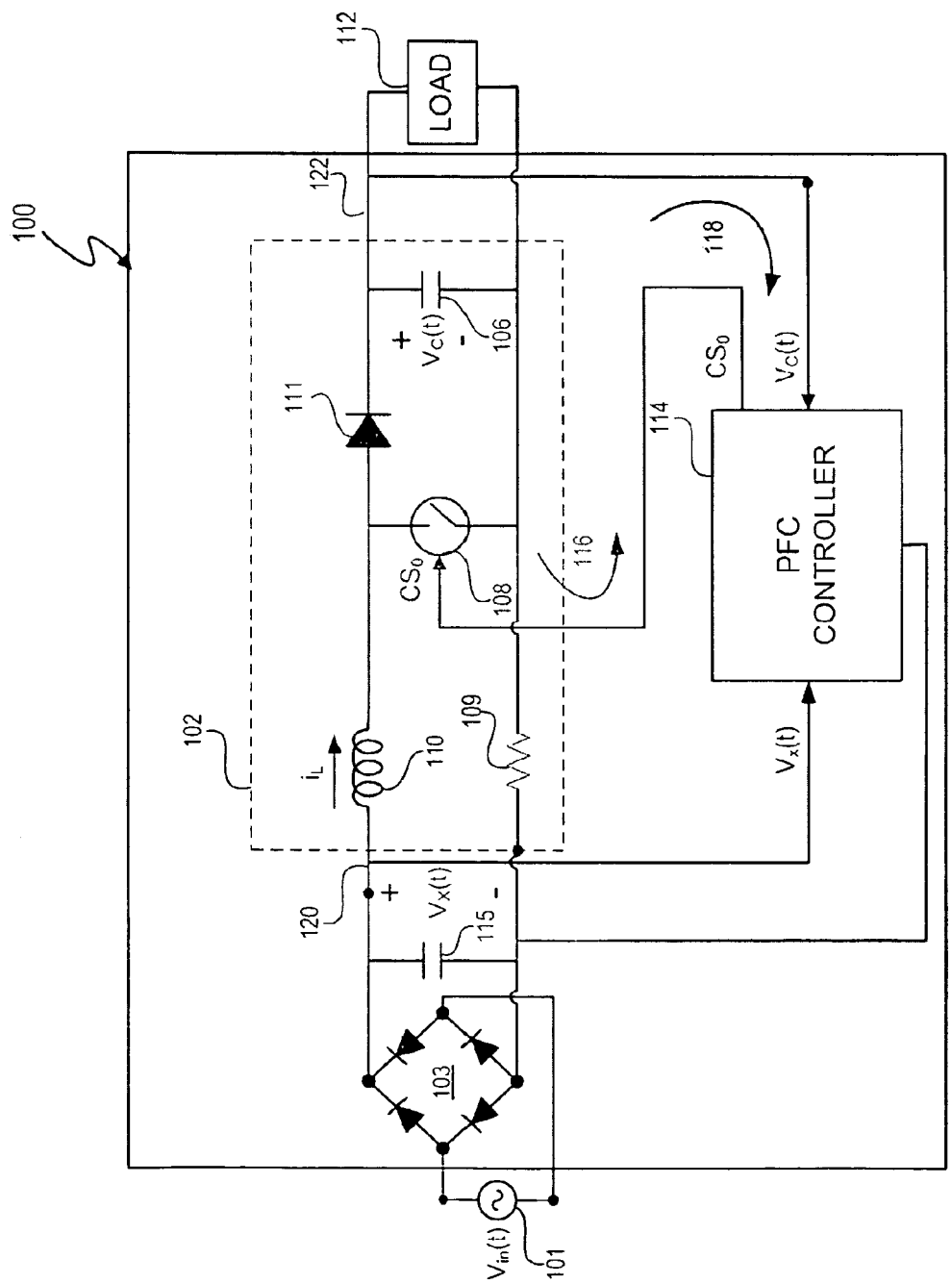
FIG. 1 (labeled prior art) depicts a power factor corrector.
Figure 2A:
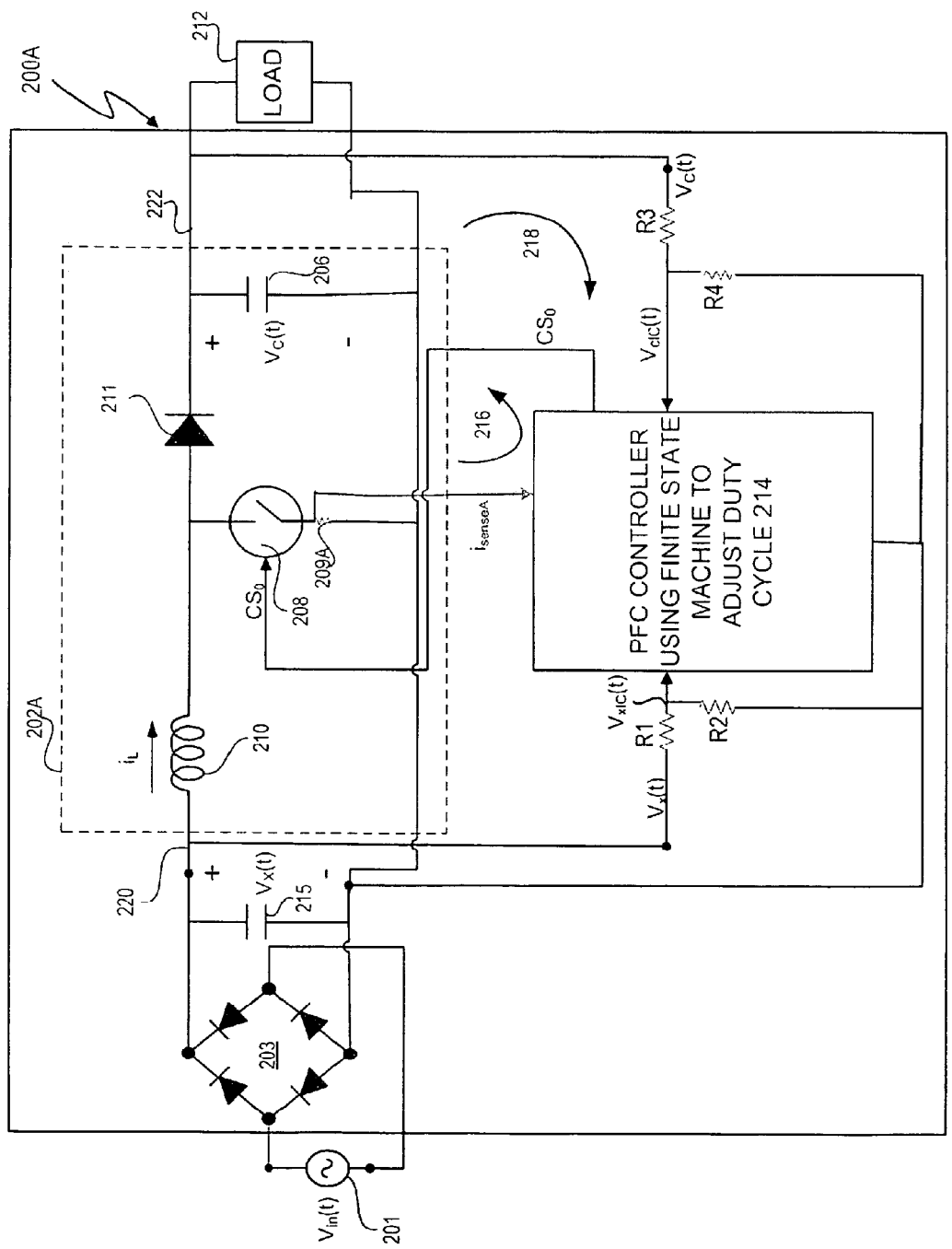
FIG. 2A depicts a preferred embodiment of a power factor corrector having a switch-mode boost stage and a finite state machine that utilizes a sensed current and a target current in order to adjust the duty cycle of a PWM control signal that controls a switch of the switch-mode boost stage.
Figure 2B:
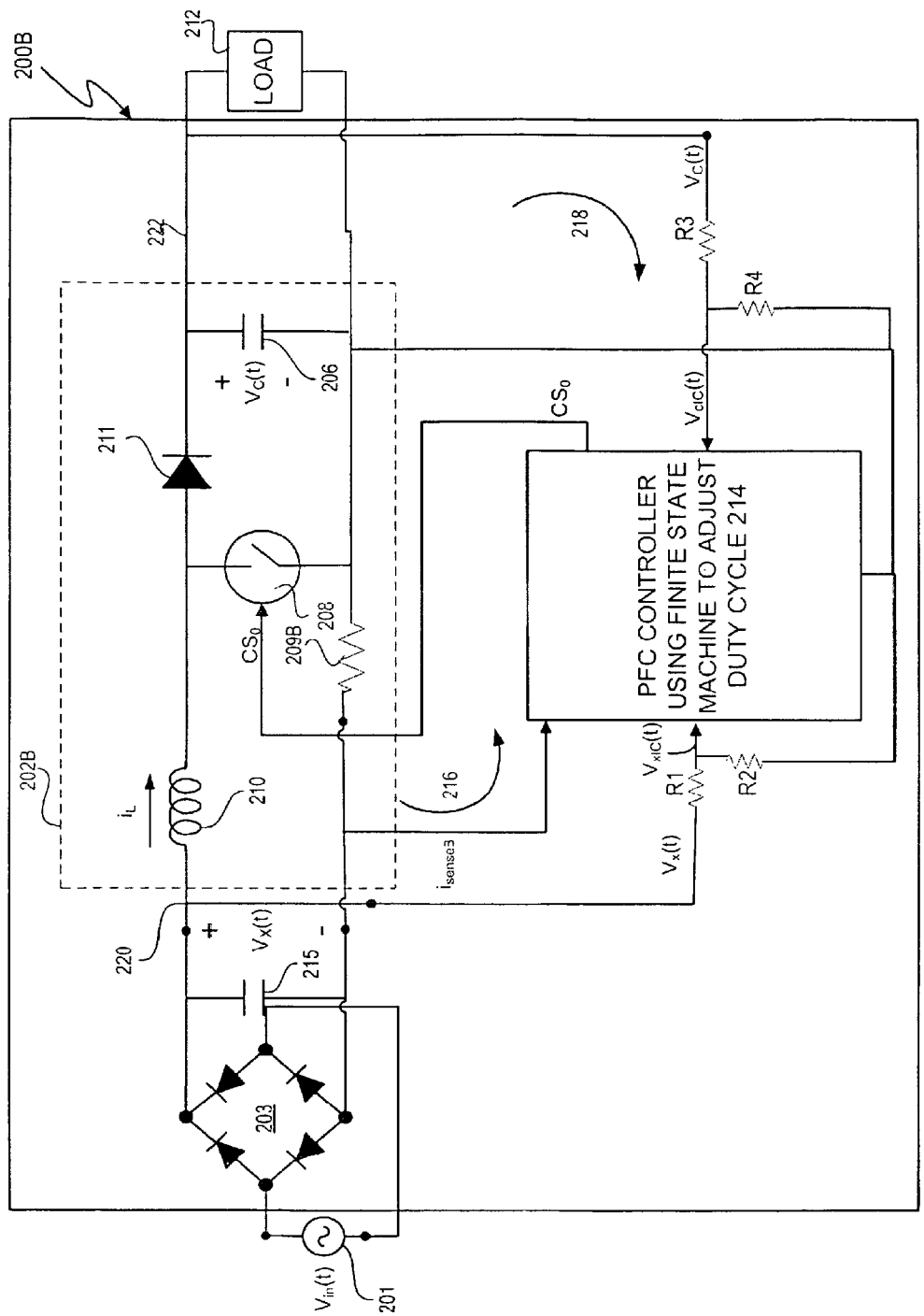
FIG. 2B depicts another preferred embodiment of a power factor corrector having a switch-mode boost stage and a finite state machine that utilizes a sensed current and a target current in order to adjust the duty cycle of a PWM control signal that controls a switch of the switch-mode boost stage.

A power factor corrector includes a switch-mode boost stage and a power factor correction (PFC) controller that includes a finite state machine which adjusts the duty cycle of a Pulse Width Modulation (PWM) switching control signal for controlling a control switch of a switch-mode boost stage in accordance with the principles of the present invention. In the implementation of this invention (e.g., as shown in FIGS. 2A and 2B), it is necessary to observe the current (e.g., $i_L$) in the inductor (inductor 210). Two possible implementations for the current observation will be discussed in detail below. "$i_{sense}$" is herein used as a generic term for the observed current. The embodiment of power factor corrector 200A in FIG. 2A only observes sensed current $i_{sense}$ (e.g., switch current $i_{senseA}$) when switch 208 is on. The embodiment of power factor corrector 200B in FIG. 2B observes sensed current $i_{sense}$ (e.g., boost inductor current $i_{senseB}$) all of the time (e.g., whether switch 208 is on or off).

FIG. 2A depicts power factor corrector 200A, and power factor corrector 200A includes a switch-mode boost stage 202A and a PFC controller 214. PFC controller 214 uses a finite state machine to adjust the duty cycle of a PWM switching control signal $CS_0$ in accordance with the principles of the present invention. Power factor corrector 202A comprises full-wave diode bridge rectifier 203; capacitor 215; switch-mode boost stage 202A; and PFC controller 214. Switch-mode boost stage 202A further includes inductor 210, diode 211, switch 208, and capacitor 206. Power factor corrector 200A implements a high bandwidth current loop 216 and a slower voltage loop 218. A line (mains) voltage source 201 can couple to the input of power factor corrector 200A, and a load 212 can couple to the output of power factor corrector 200A. Power factor corrector 200A operates in the similar manner as power factor 100 as described above earlier except for the manner in which switch 208 is controlled.

In the embodiment of power factor corrector 200A, switching of switch 208 is calculated and performed so that the average current of boost inductor current $i_L$, being the line input current, varies proportionally with the rectified line input voltage $V_x(t)$ where the proportionality ratio is selected such that the capacitor link voltage/output voltage $V_c(t)$ is regulated. The goal of making power factor corrector 200A appear resistive to the voltage source 201 is further accomplished by coupling a sense current resistor 209A in series with switch 208 (e.g., coupled between switch 208 and the negative node of line input voltage $V_x(t)$). Thus, the sensed current $i_{sense}$ in this case is the switch current $i_{senseA}$. Switch current $i_{senseA}$ is being utilized to provide PFC control of switch-mode boost stage 202A, and this PFC control will be discussed later when FIG. 9A is discussed in more detail. PFC controller 214 also has a finite slate machine which is used to adjust the duty cycle of the PWM switching control signal.

PFC controller 214 and its operations and functions can be implemented on a single integrated circuit. A voltage divider comprising resistors R1 and R2 is coupled to the input of the PFC controller 214 where the line input voltage $V_x(t)$ is fed in, and another voltage divider comprising resistors R3 and R4 is coupled to the input of the PFC controller where the link output voltage $V_c(t)$ is fed in. The values for resistors R1, R2, R3, and R4 are selected so that the voltage dividers scale down the line input voltage $V_x(t)$ and link output voltage $V_c(t)$ to scaled line input voltage $V_{xIC}(t)$ and scaled link output voltage $V_{cIC}(t)$ that can be used for an integrated circuit. In implementing power factor corrector 200A, the inductor current $i_L$ is observed only when switch 208 is on.

FIG. 2B depicts another preferred embodiment power factor corrector 200B. Power factor corrector 200B is identical to power factor corrector 200A except that instead of using a switch current resistor 209A in which switch current $i_{senseA}$ is used to provide PFC control of switch-mode boost stage 202A, a boost inductor current sense resistor 209B is utilized effectively in series with inductor 210. Boost inductor current $i_{senseB}$ in this alternate embodiment is used to provide PFC control of switch-mode boost stage 202B, and this PFC control will be discussed later when FIG. 9B is discussed in more detail. PFC controller 214 still uses a finite state machine (e.g., finite state machine 304) to adjust the duty cycle of PWM switching control signal $CS_0$ in accordance with the principles of the present invention. PFC controller 214 in power factor corrector 200B and its operations and functions can also be implemented on a single integrated circuit. The voltage dividers comprising the same resistors R1, R2, R3, and R4 for power factor corrector 200A can be utilized to scale down the line input voltage $V_x(t)$ and link output voltage $V_c(t)$ in power factor corrector 200B to scaled line input voltage $V_{xIC}(t)$ and scaled link output voltage $V_{cIC}(t)$ that can be used for an integrated circuit. In implementing power factor corrector 200B, the inductor current $i_L$ is observed all of the time (e.g., whether switch 208 is on or off).

Typical values for sense resistor 209A or 209B are from 0.05 to 0.5 ohm. The manners of sensing current are certainly not limited to the use of sense resistors or the power factor correctors 200A and 200B disclosed in FIGS. 2A and 2B. Other current sense techniques can alternatively include the use of current sense transformers or Hall effect devices.

Figure 3:
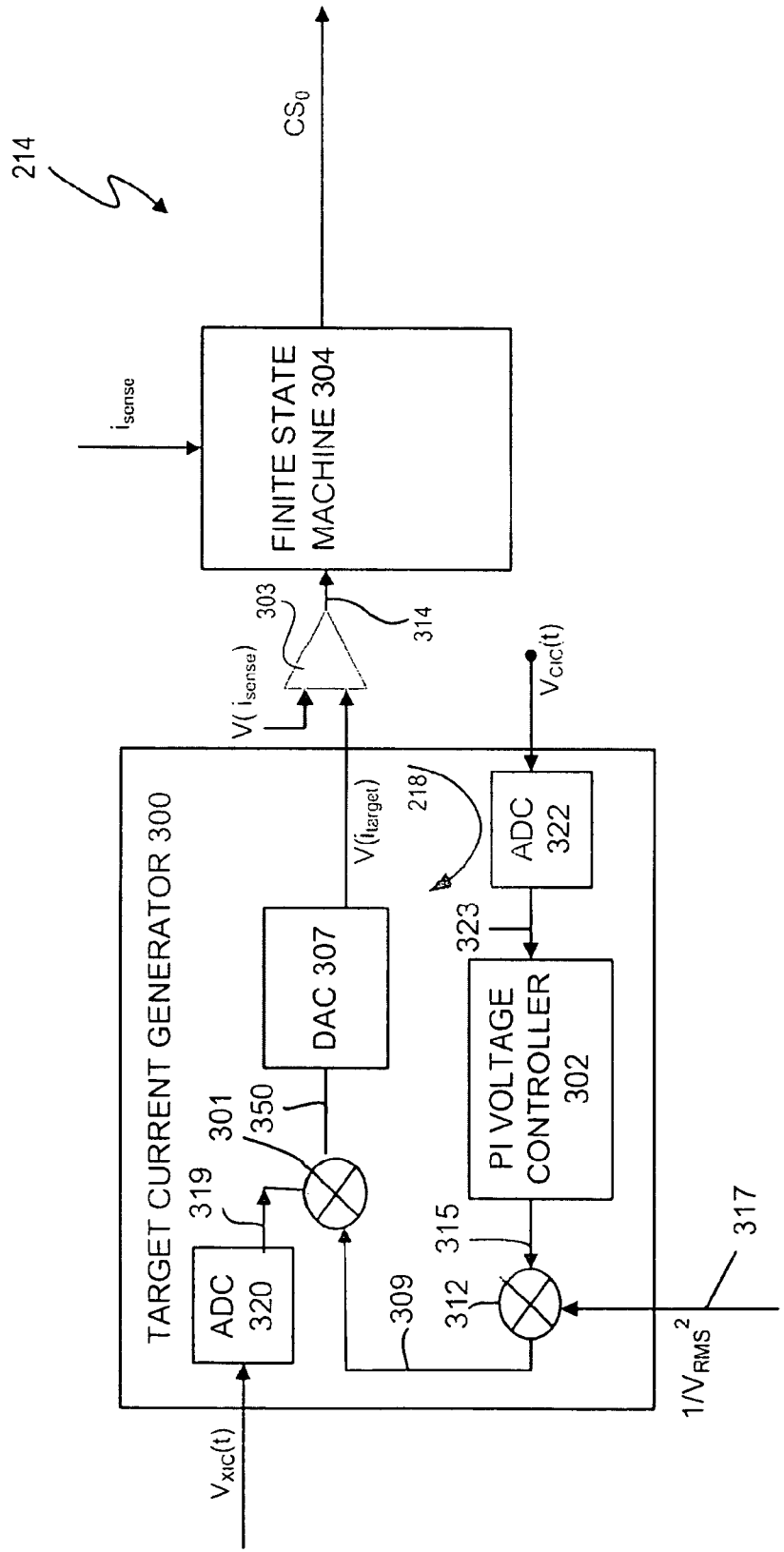
FIG. 3 depicts details of an exemplary PFC controller shown in FIGS. 2A and 2B.

FIG. 3 shows details of an exemplary PFC controller 214 as used in power factor correctors 200A and 200B in respective FIGS. 2A and 2B. Exemplary PFC controller 214 includes a target current generator 300, a comparator 303, and a finite state machine 304 coupled together in the manner shown in FIG. 3. Target current generator 300 includes an analog-to-digital converter (ADC) 320, a multiplier 301, a digital-to-analog convener (DAC) 307, a multiplier 312, a digital proportional-integral (PI) voltage controller 302, and an ADC 322. Digital PI controller 302 may be a typical PI controller having a proportional circuit path and an integral circuit path.

Integrated Circuit (IC) scaled link output voltage $V_{cIC}(t)$ of slower voltage loop 218 is fed into ADC 322, and the corresponding digital output signal 323 of ADC 322 is fed into the digital PI voltage controller 302. PI controller 302 preferably is in the form of an Infinite Impulse Response (IIR) digital filter. The output of the IIR filter (e.g., PI output signal 315 from PI controller 302) is proportionate to the estimated power demand of load 212 to be delivered to switch-mode boost stage 202A or 202B. PI output signal 315 is fed into multiplier 312. A scaling factor signal 317 that is equivalent to $1/V_{rms}^2$ is also fed into multiplier 312. Multiplier 312 multiplies the values from scaling factor signal 317 and PI output signal 315 and generates scaled digital output voltage signal 309.

Figures 6A, 6B:
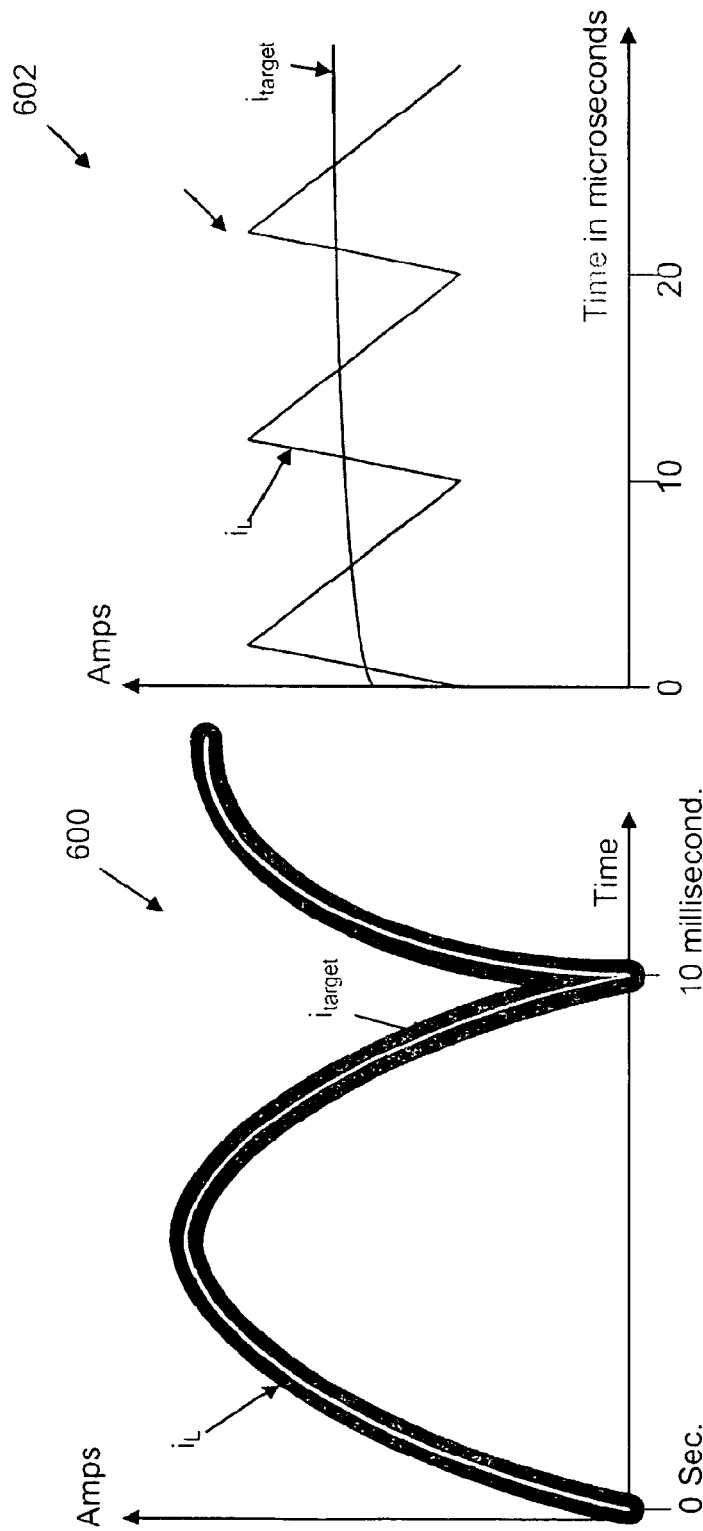
FIG. 6A depicts exemplary current waveforms of rectified line input current (e.g., average boost inductor current: $i_L$) and target current (e.g., $i_{target}$) for the power factor correctors of FIGS. 2A and 2B shown at a time scale of 10 milliseconds.
FIG. 6B depicts exemplary current waveforms of rectified line input current (e.g., average boost inductor current $i_L$) and target current (e.g., $i_{target}$) for the power factor correctors of FIGS. 2A and 2B shown at a time scale of 10 microseconds.

ADC 320 receives IC scaled line input voltage $V_{xIC}(t)$ and provides a corresponding digital output signal 319 which is a digital representation of IC scaled rectified line input voltage $V_{xIC}(t)$. Digital output signal 319 is fed into multiplier 301. Multiplier 301 multiplies values of scaled digital output voltage signal 309 by values of digital output signal 319 to provide a digital output product value 350. Digital output product value 350 is fed into DAC 307, and DAC 307 converts the digital output product value 350 into a reference voltage $V(i_{target})$ that is representative of the target current value $(i_{target})$. A sensed current voltage $V(i_{sense})$ (e.g., sensed current value) is a voltage that is representative of a sensed current signal $i_{sense}$, which may be switch current $i_{senseA}$ in switch-mode boost stage 202A or boost inductor current $i_{senseB}$ in switch-mode boost stage 202B. Comparator 303 compares reference voltage $V(i_{target})$ with sensed current voltage $V(i_{sense})$. Reference voltage $V(i_{target})$ corresponds and is proportional to a target current $i_{target}$, which is the desired average inductor current for line input current $i_L$. Target current $i_{target}$, being proportionate to line input voltage $V_x(t)$, ensures that the line input current $i_L$ has a high power factor and low distortion. Target current $i_{target}$ is a full-wave rectified sinusoidal current waveform as shown in FIGS. 6A and 6B.

Figure 10:
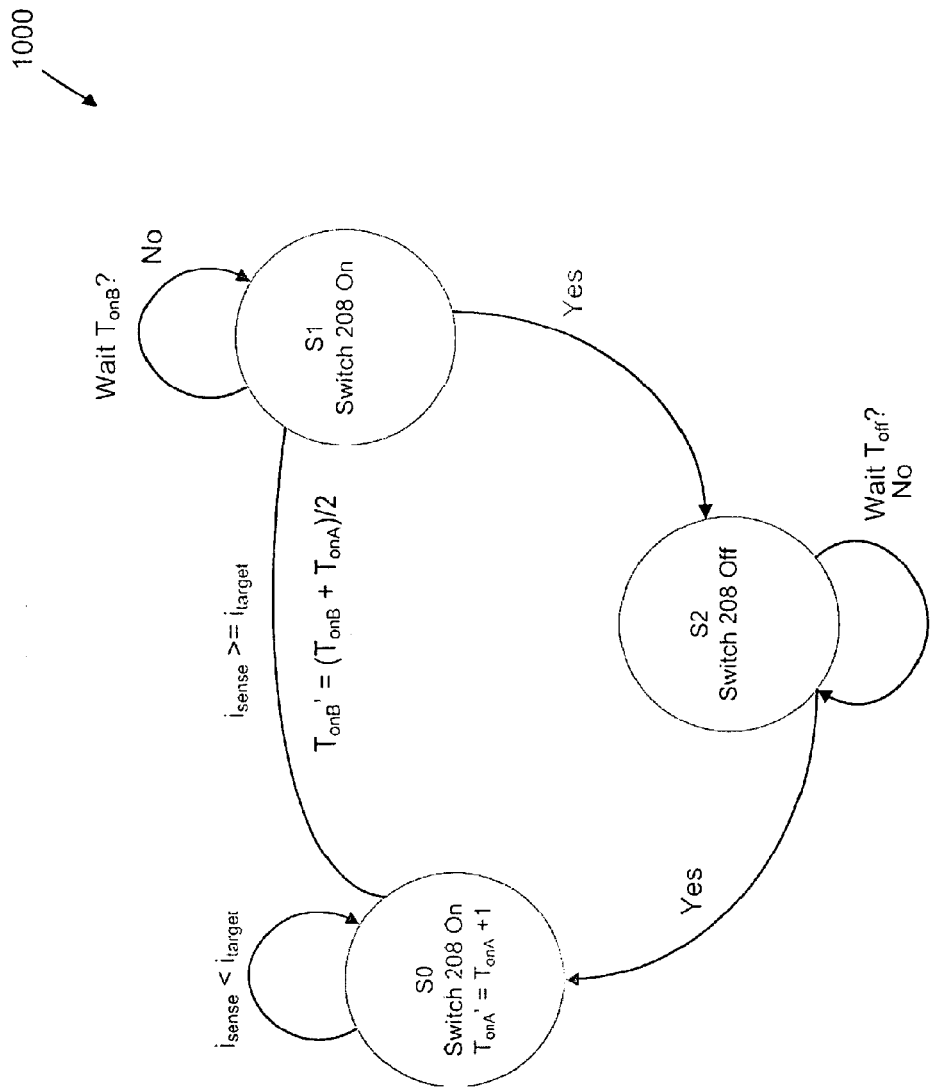
FIG. 10 depicts a slate diagram for implementing by the finite state machine shown in FIGS. 3 and 4 either the preferred switch control algorithm as characterized by the exemplary current waveforms of FIG. 9A or the other preferred switch control algorithm as characterized by the exemplary current waveforms of FIG. 9B.
Figure 11:
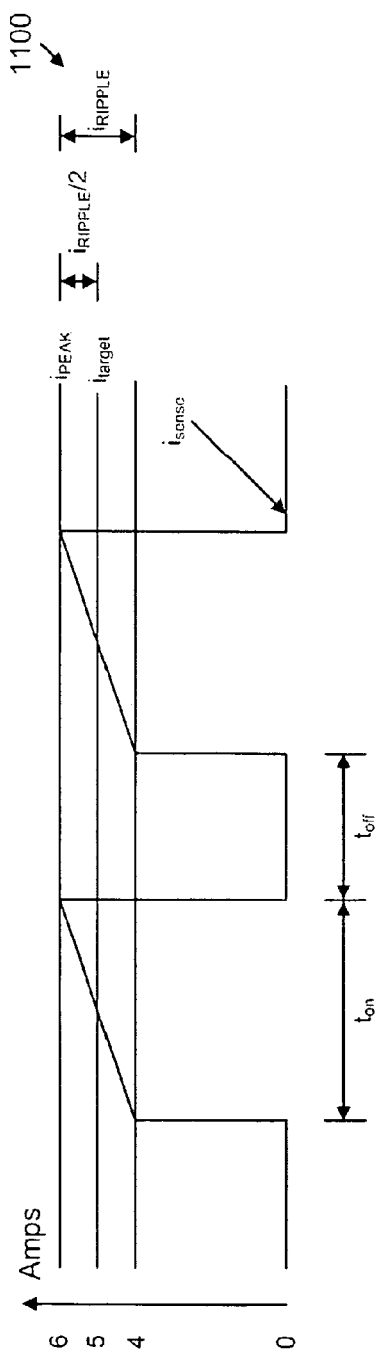
FIG. 11 depicts exemplary current waveforms for a still further preferred switch control algorithm for the power factor corrector shown in FIG. 2A in which on-time of the switch current is determined when the switch current reaches a peak current that is determined by a target current and a ripple current.
Figure 12:
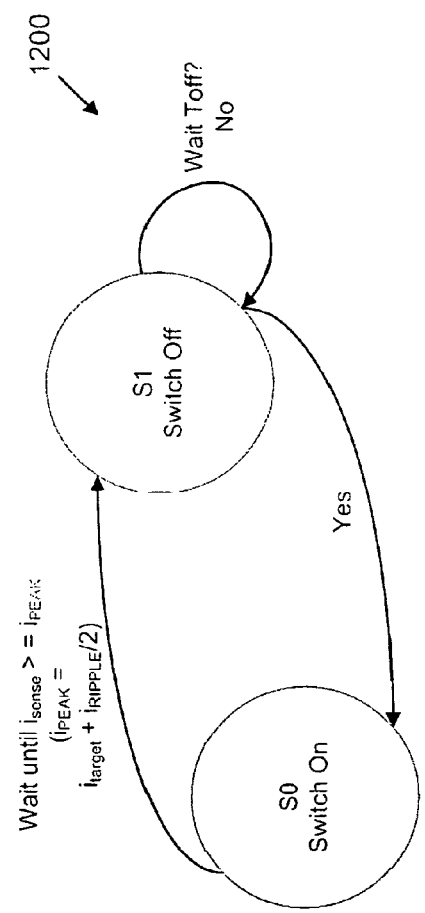
FIG. 12 depicts a state diagram for implementing by the finite state machine shown in FIGS. 3 and 4 the preferred switch control algorithm as characterized by the exemplary current waveforms of FIG. 11.

Comparator 303 outputs a voltage comparison result signal 314, which in this example is a two-level current comparison result signal (e.g., "two-level" implying one state of the comparison, such as above a desired threshold, and another state of comparison, such as below a desired threshold), and voltage comparison result signal 314 is fed into finite state machine (FSM) 304. Finite state machine 304 processes an FSM algorithm (e.g., switch control algorithm) that adjusts the duty cycle of the PWM switching control signal $CS_0$ based on the received voltage comparison result signal 314 to control switch 208 in accordance with the principles of the present invention. One present invention embodiment of the FSM algorithm is controlling or adjusting the switch timing of PWM switching control signal $CS_0$ such that the boost inductor current $i_L$ is above the target current threshold fifty percent (50%) of the time and below the target current threshold the other fifty percent (50%) of the time. This embodiment of the FSM algorithm will be discussed in more detail when FIGS. 9A, 9B, and 10 are described later. Another present invention embodiment of the FSM algorithm is controlling or adjusting the switch timing of PWM switching control signal $CS_0$ such that control switch 208 is activated until the boost inductor current $i_L$ reaches a target current $i_{target}$ that is equal to a peak current value $i_{peak}$ determined by $i_{target} + i_{RIPPLE}/2$ where $i_{target}$ is a target current and $i_{RIPPLE}$ is a peak-to-peak ripple current in the inductor 210. This other embodiment of the FSM algorithm and these current values and equations will be discussed in more detail when FIGS. 11 and 12 are described later.

The embodiment shown for PFC controller 214 in FIG. 3 is exemplary, and there are many possible variations. The multipliers may be analog instead of digital, removing the associated analog-to digital (A/D) and digital-to-analog (D/A) conversion steps. The analog input signals may be currents instead of voltages. The input sine wave may be synthesized by a table look up of function generator, and synchronized to the external line. The comparator may be digital, and the current input digitized. In all cases, a current reference signal is generated and compared to the switch-mode current. The comparison is used by a finite state machine (FSM) to control the switch control duty cycle.

Figure 4:
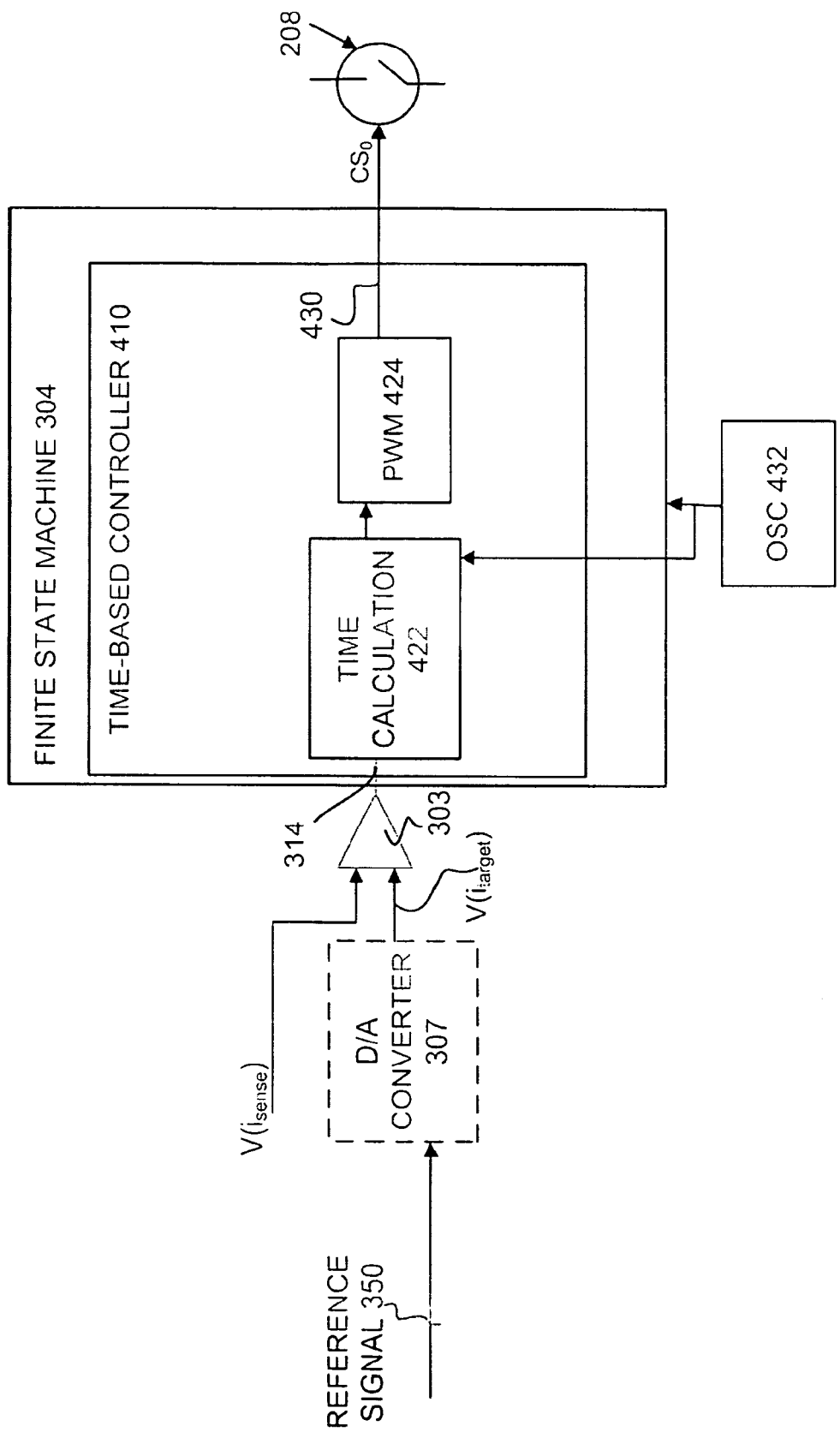
FIG. 4 depicts an exemplary finite state machine of FIG. 3 that shows details of a digital implementation of a time-based controller.

With reference now to FIG. 4, an exemplary finite state machine (FSM) 304 is illustrated. FSM 304 comprises a time-based controller 410. Exemplary time based controllers are disclosed in pending U.S. patent application Ser. No. 11/864,366 filed on Sep. 28, 2007 entitled "Time-Based Control of a System Having Integration Response" to John Melanson and assigned to common assignee Cirrus Logic, Inc., Austin, Tex. (hereafter the "Time-Based Control patent case"). The Time-Based Control patent case is hereby incorporated by reference.

As indicated by its name, time-based controller 410 implements a time-based control methodology, rather than one of the conventional magnitude-based control methodologies described above. Voltage comparison result signal 314 is received by time calculation logic 422 that, responsive thereto, determines the time at which the state of switch 208 should be changed in order to maintain the average value of sensed current signal $i_{sense}$ at the target average value (e.g., target current $i_{target}$). Time-based controller 410 includes a pulse-width modulator (PWM) 424 that asserts or deasserts control signal 430 to change the state of switch 208 at the time indicated by time calculation logic 422. Furthermore, an oscillator 432 feeds into FSM 304 and into time calculation logic block 422. Oscillator 432 is utilized for implementing the desired FSM algorithm.

Figure 5:
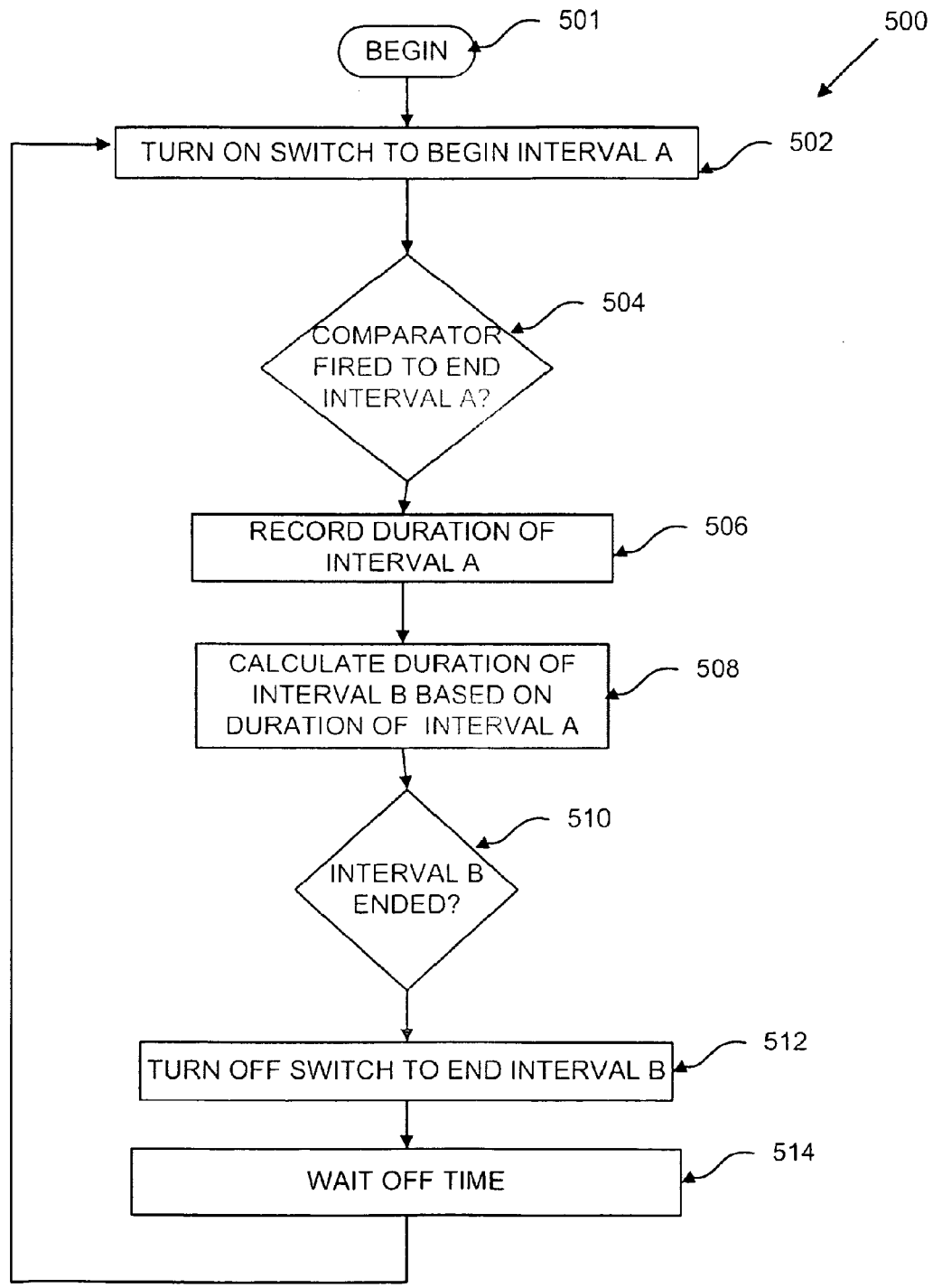
FIG. 5 depicts a high level logical flowchart of the operation of a digital implementation of the time-based controller shown in FIG. 4.

With reference now to FIG. 5, there is illustrated a high level logical flowchart of the operation of a digital implementation of the time-based controller 410 of FIG. 4. The illustrated process can be implemented by an application specific integrated circuit (ASIC), general purpose digital hardware executing program code from a tangible data storage medium that directs the illustrated operations, or other digital circuitry, as is known in the art. Further, the illustrated process can be utilized to implement any of the time-based constant period, time-based constant off-time, time-based variable period, or time-based variable off-time control methodologies.

Figure 7A:
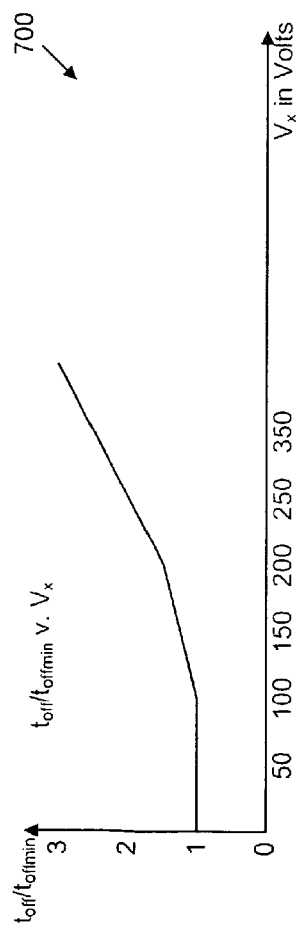
FIG. 7A depicts a transfer function of the representative voltage $V_x$ function generator of FIG. 6C showing the off-time-to-minimum off-time ratio ($t_{off}/t_{offmin}$) being mapped against values of line input voltage ($V_x$).

The process shown in FIG. 5 begins at block 501 and then proceeds to block 502, which depicts time-based controller 410 asserting control signal $CS_0$ (e.g., placing control signal $CS_0$ in a first state) to turn on switch 208 and thus begin a time interval A (e.g., time $t_{onA}$ in FIGS. 7A and 9). Next, the process iterates at block 504 until comparator 418 indicates that time interval A has ended by signaling that the value of sensed current signal $i_{sense}$ has crossed the value of target current $i_{target}$ in this case, in a positive transition. The change in relative magnitudes of voltage comparison result signal 314 and sensed current signal $i_{sense}$ thus causes a polarity change in the output of comparator 303 indicating (in this embodiment) that sensed current signal $i_{sense}$ is at least as great as target current $i_{target}$ (or in other embodiments, that sensed current signal $i_{sense}$ is equal to or less than target current $i_{target}$). In response to comparator 303 indicating that sensed current signal $i_{sense}$ has crossed target current $i_{target}$ in a positive transition, time calculation logic 422 records the duration of time interval A (block 506) based upon the value of a digital counter or timer. Time calculation logic 422 then calculates the duration of time interval B (e.g., time $t_{onB}$ in FIGS. 7A and 9), for example, utilizing one of the equations (e.g., Equation B for calculating the on-time $t_{onB}$) that will be later discussed with FIG. 10 (block 508).

As shown at blocks 510 and 512, pulse width modulator 424 then detects (e.g., utilizing a digital counter or timer) when the calculated duration of time interval B has elapsed from the time comparator 303 indicating the end of time interval B. In response to a determination that the calculated duration of time interval B has elapsed, pulse width modulator 424 deasserts control signal $CS_0$ (e.g., places control signal $CS_0$ in a second state) to turn off switch 208. Pulse width modulator 424 thereafter waits a fixed or variable off time (time interval $t_{off}$ in FIGS. 7A and 9) in accordance with the selected control methodology (block 514) and again asserts the control signal $CS_0$ to turn on switch 208 and begin time interval A (e.g., time $t_{onA}$) of a next cycle of operation, as shown in block 502. The process thereafter proceeds as has been described.

With reference now to FIG. 6A, a plot 600 of exemplary current waveforms (in Amps) of line input current (e.g., average boost inductor current $i_L$) and target current $i_{target}$ for the power factor correctors of FIGS. 2A and 2B are shown at a time scale of 10 milliseconds. The exemplary waveforms are viewed from the perspective of the rectified line (mains) rate of exemplary 100 Hz. From this line (mains) rate perspective shown in FIG. 6A, the target current $i_{target}$ is seen as half of a full-wave rectified sinusoidal waveform and is varying or moving. Even though the dark thick lines which represent the current waveform for inductor current $i_L$ appear to be solid, they are actually not solid lines and represent that the inductor current iL is moving at a fast rate and thus appears to be a solid line in relative to the current waveform for target current $i_{target}$. With reference now to FIG. 6B, a plot 602 of exemplary current waveforms (in Amps) of line input current (e.g., average boost inductor current $i_L$) and target current (e.g., $i_{target}$) for the power factor correctors of FIGS. 2A and 2B are shown at a time scale of 10 microseconds. The exemplary waveforms are viewed from the perspective of the switch rate of exemplary 100 kHz (e.g., switch rate for switch 208). From this perspective shown in FIG. 6B, the target current $i_{target}$ is seen as pseudo-stationary.

Thus, in this specification, the term "switch rate stationary" is defined and understood to mean that a signal is varying at the scale of the line (mains) rate but is treated as stationary or constant at the scale (from the perspective) of the switch rate, particularly for the purposes of implementing the FSM algorithm (e.g., switch control algorithm) of the present invention. This treatment of the signal as stationary is possible since the switch rate is so much greater than the line input rate (on the order of 100 to 1000 times greater). If, for example, the off-time is varied slowly, then the term "switch rate stationary" and its definition and implications still apply. Power factor correctors 200A and 200B which vary the off-time $t_{off}$ slowly can also be described as "On-time controlled by Fast Current Feedback (e.g., current loop 216), Off-time controlled by Slow Voltage Feedforward (e.g., $V_x$)". The slow voltage feedforward does not substantively interfere with the operation of the fast current feedback.

In this specification, when operating modes or averages are discussed, the time scale is considered to be at the switch rate unless otherwise specified. Thus, when switch-mode boost stage 202A or 202B draws a current proportionate to the line (mains) voltage, it is implied that the current is averaged across a few cycles of the switch rate. Furthermore, a "constant-off time" mode would imply that the off time is relatively the same within a few switching cycles at the switch rate but may vary at the line (mains) rate. Variation at the line rate may be advantageous to efficiency and Radio Frequency Interference (RFI) mitigation.

The embodiments of power factor correctors 200A and 200B and any other suitable power factor corrector embodiment are able to vary the duty cycle of PWM control signal $CS_0$ generally in at least three different methods. The first method, which is the preferred embodiment, is over periodic cycles of sensed current $i_{sense}$, to vary the on-time $t_{on}$ of switch 208 (e.g., $t_{onA}$ and $t_{onB}$ shown in FIGS. 7A, 7B, and 9) and to maintain the off-time $t_{off}$ switch 208 (e.g., $t_{off}$ shown in FIGS. 7A, 7B, and 9) as a constant. The advantages of this first method of varying the duty cycle is that the mathematical calculations required for implementing such an algorithm is relatively simple, noise is spread over a broad spectrum, and the control provided for PFC controller 214 is stable. For example, calculating an on-time $t_{onB}$ for switch 208 for one of the preferred embodiments simply involves the recurrent equation $T_{onB}' = (T_{onB} + T_{onA})/2$, and this equation will be discussed in more detail when FIG. 10 is later described. The second method is over periodic cycles of sensed current $i_{sense}$, to maintain the on-time $t_{on}$ of switch 208 (e.g., $t_{onA}$ and $t_{onB}$ shown in FIGS. 7A, 7B, and 9) as a constant and to vary the off-time $t_{off}$ of switch 208 (e.g., $t_{off}$ shown in FIGS. 7A, 7B, and 9). The third method is to maintain the period of sensed current $i_{sense}$ constant and to vary the on-time $t_{on}$ and off-time $t_{off}$ of switch 208 accordingly. The third method requires more mathematical calculations but is preferred in some cases where complete control of the switching frequency rate of control signal $CS_0$ for switch 208 is needed. In the third method where the period of sensed current $i_{sense}$ is held constant, noise in the output 350 of comparator 303 may exist and thus more filtering may be added. An example would be to have filtering that provides the following mathematical relationship for on-time $t_{on}$: $t_{onB}' = \frac{3}{4} t_{onB} + \frac{1}{4} t_{onA}'$. The $t_{onA}'$ notation is used to identify the new values from this period of sensed current $i_{sense}$.

Varying the off-time $t_{off}$ from the perspective of the line (mains) rate provides a higher power factor and higher efficiency for switch-mode boost stages 202A and 202B. The off-time $t_{off}$ is desirably varied across the half period of the input sine period. When the voltage input source is very high (e.g., 240 V), the inductor flyback time (off-time $t_{off}$) can be quite long. An increase of the off-time $t_{off}$ is shown in accordance with FIG. 7A. The purpose of varying off-time $t_{off}$ is to minimize distortion while maximizing efficiency. At the perspective of the line rate scale (e.g., 10 milliseconds relating to 100 Hz line rate), the off-time $t_{off}$ would be considered "constant" (e.g., not varying rapidly). However, the off-time $t_{off}$ may be varied at the line rate scale to improve performance.

A time duration generator is used to generate a time interval (such as an off-time $t_{off}$ or a switching period for switch 208) that is provided to FSM 304. An exemplary time duration generator is shown as a period function generator 652 in FIG. 6C. Period function generator 652 receives the IC scaled rectified line input voltage $V_{xIC}(t)$. Exemplary parameters are fed into period function generator 652 for generating the time interval that is a function of IC scaled rectified line input voltage $V_{xIC}(t)$. The exemplary parameters are used to define the characteristics of the period function generator 652. Exemplary parameters fed into the period function generator 652 can include at least inductor value 654 for inductor 210, time interval parameters 656, power level 658, which is the power level relating to $V_c$ detected from capacitor 206, and RMS voltage 660, which is the RMS voltage level $V_x$ across capacitor 215 detected by a RMS voltage detector.

Figure 6C:
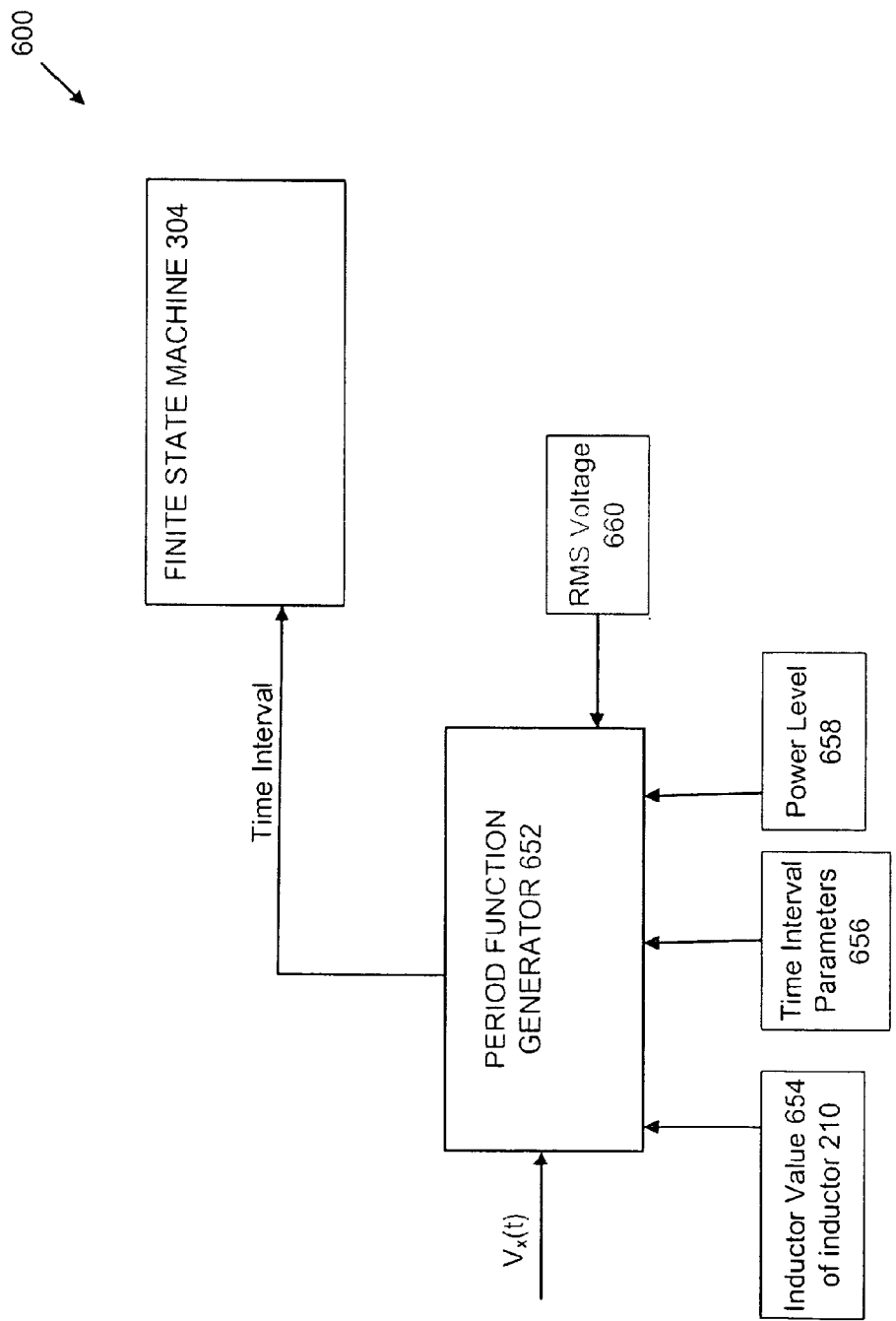
FIG. 6C depicts exemplary parameters fed into a representative voltage $V_x$ function generator for generating an off-time that is a function of line input voltage $V_x(t)$.
Figure 14E:
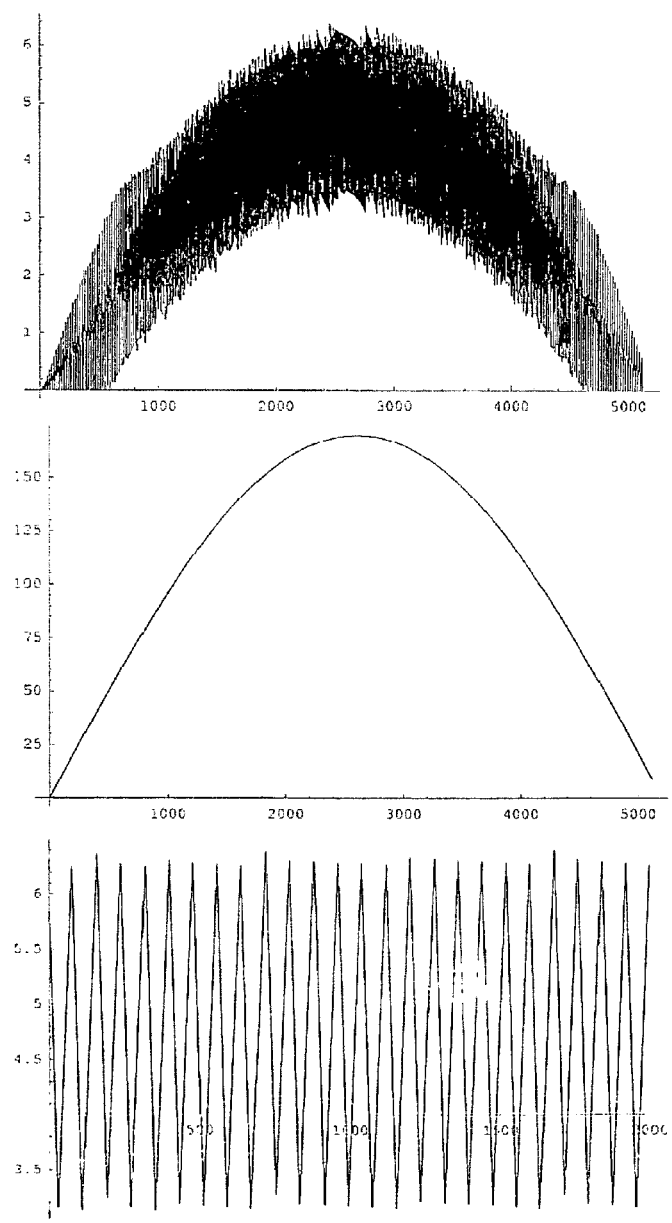
Figure 14F:
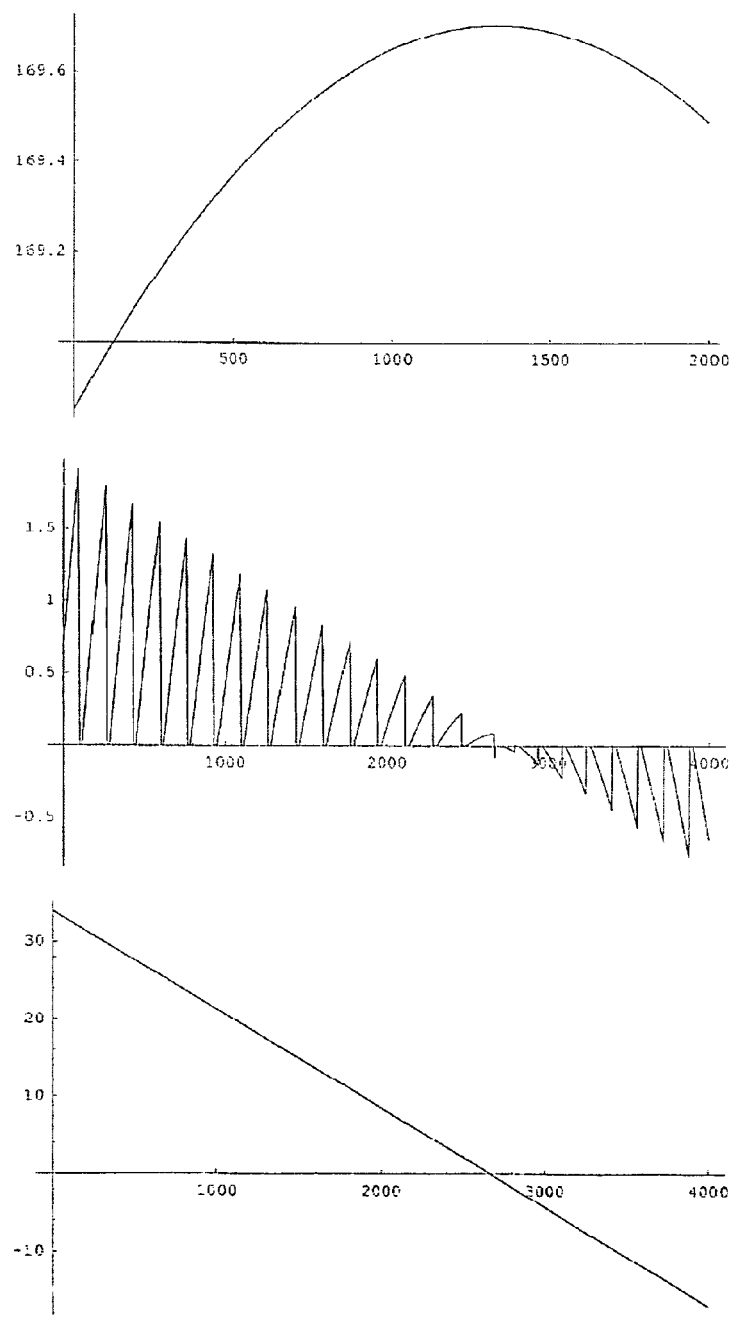
Figure 14G:
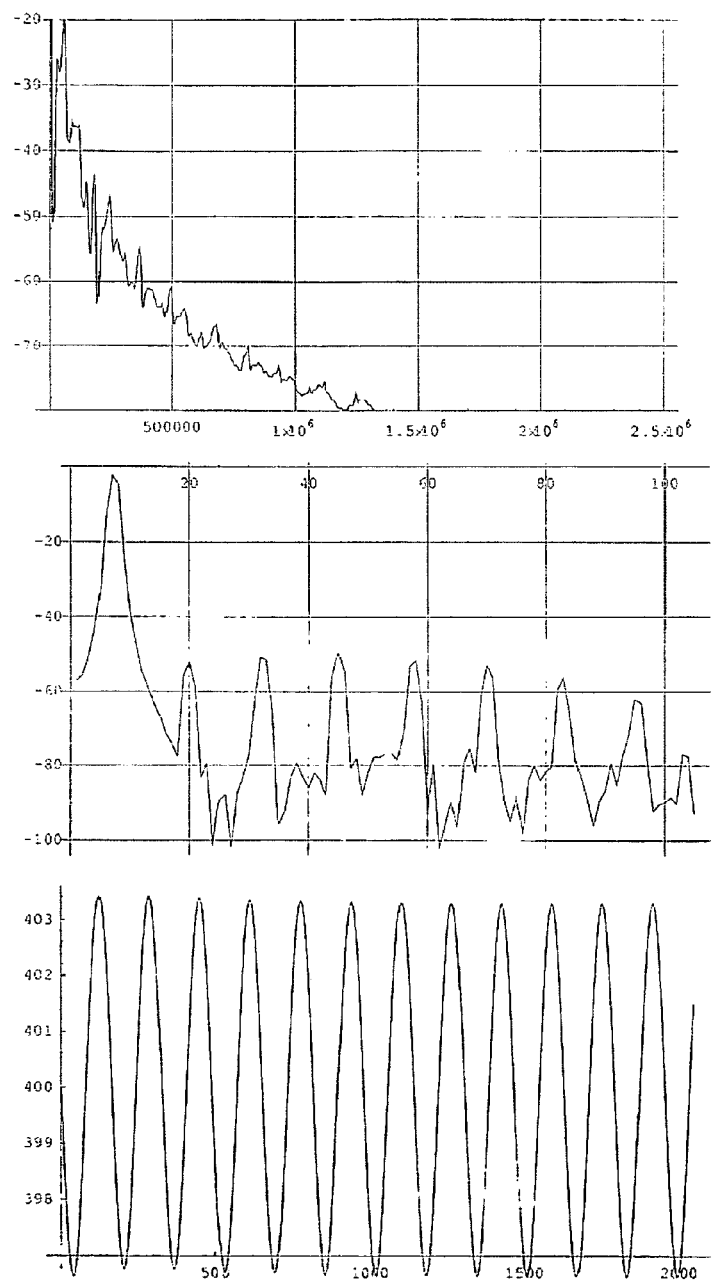
Figure 14I:
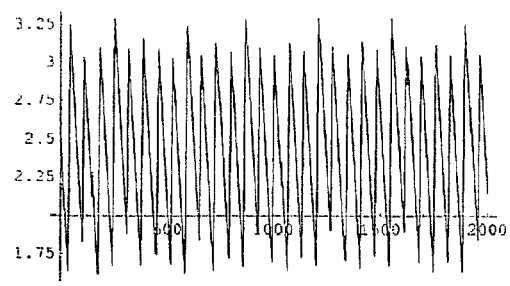
Figure 14I:
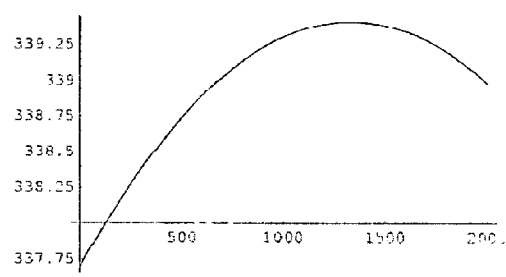
Figure 14I:
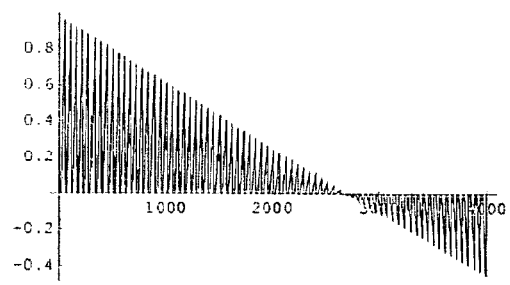
Figure 14I:
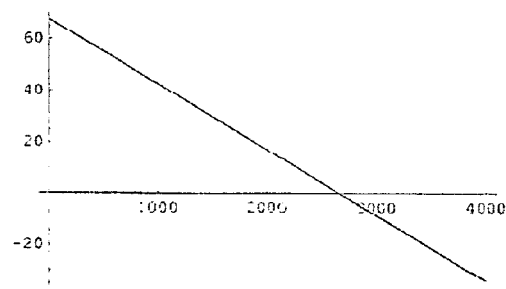
Figure 14J:
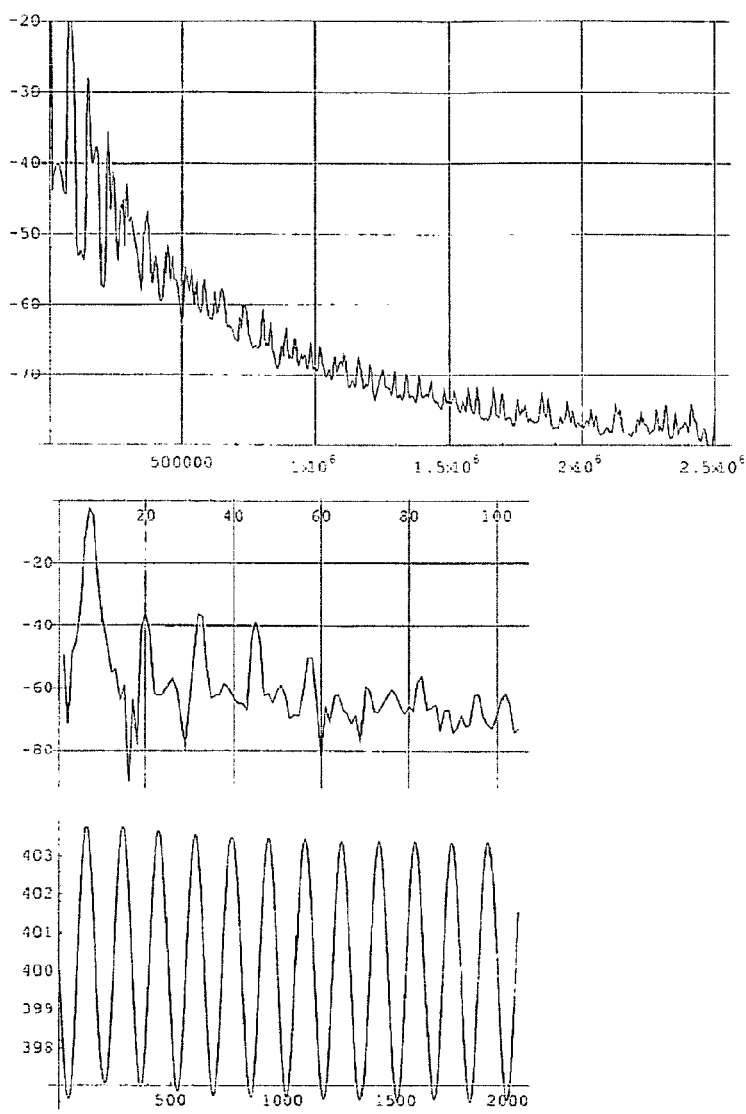
Figure 15E:
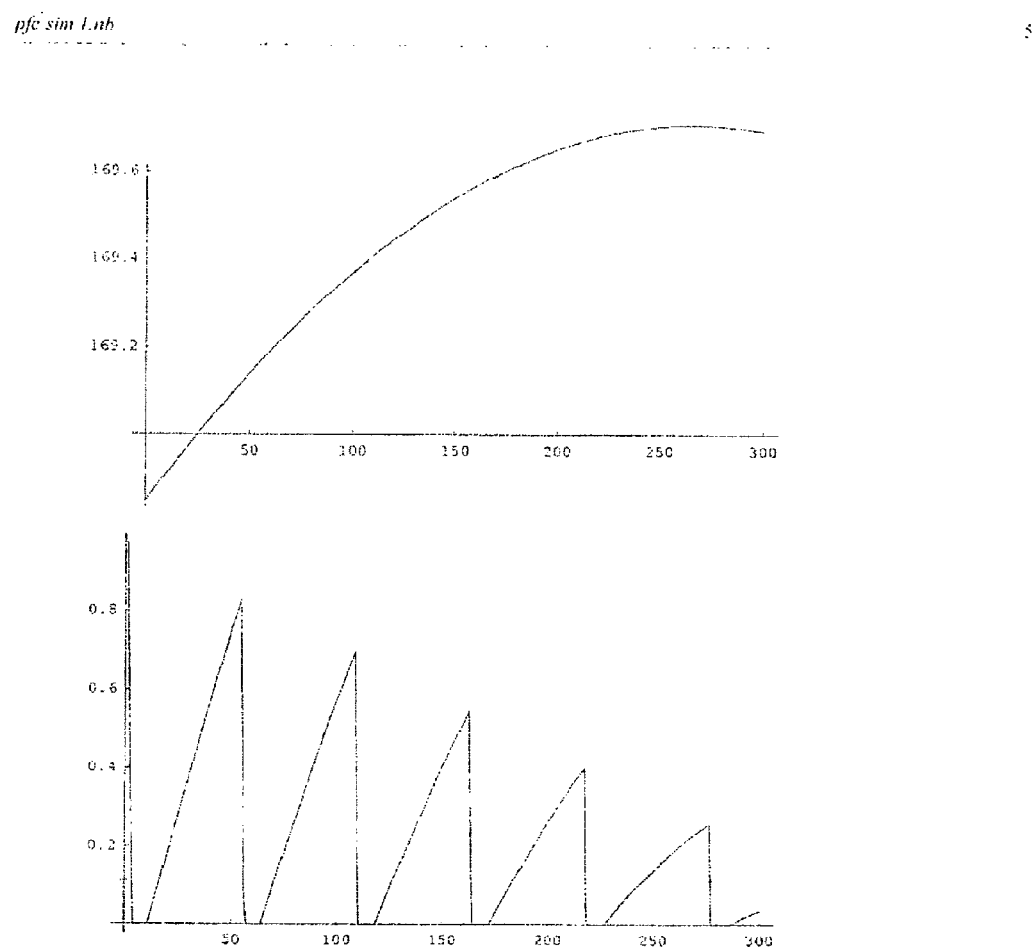
Figure 15F:
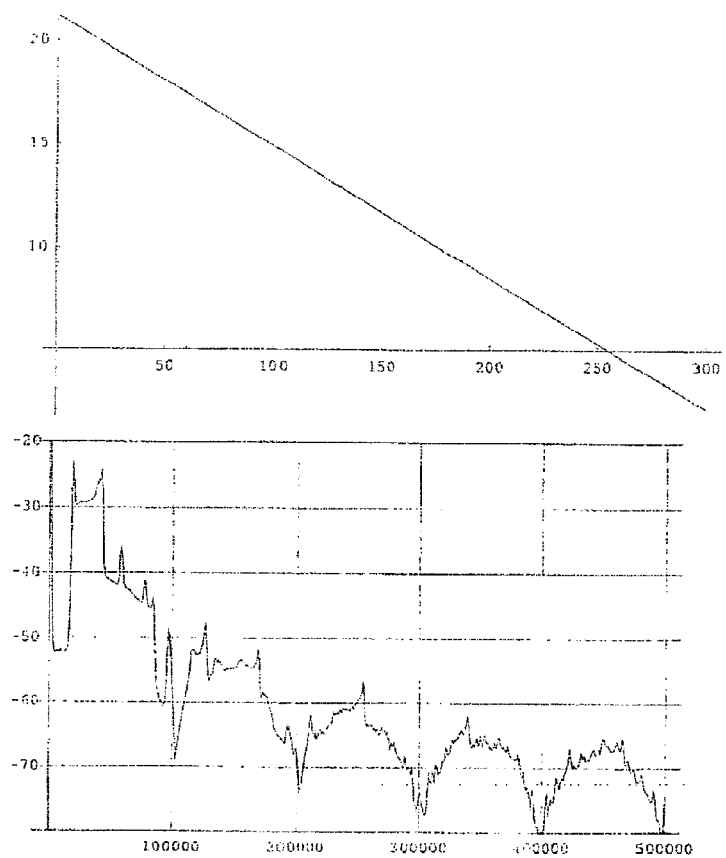
Figure 15G:
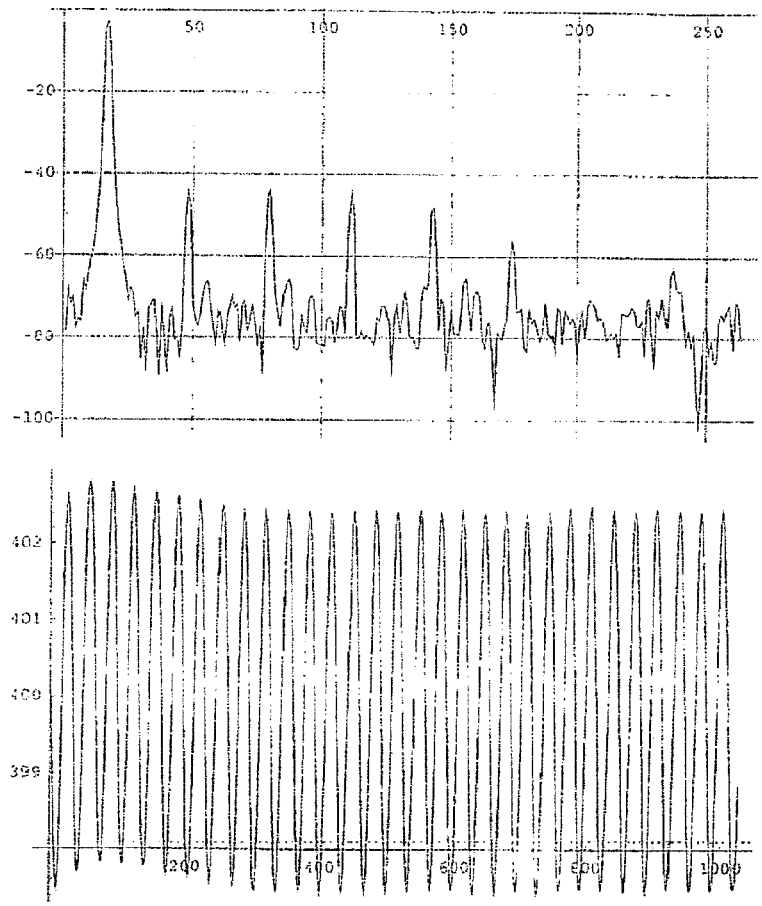
Figure 15H:
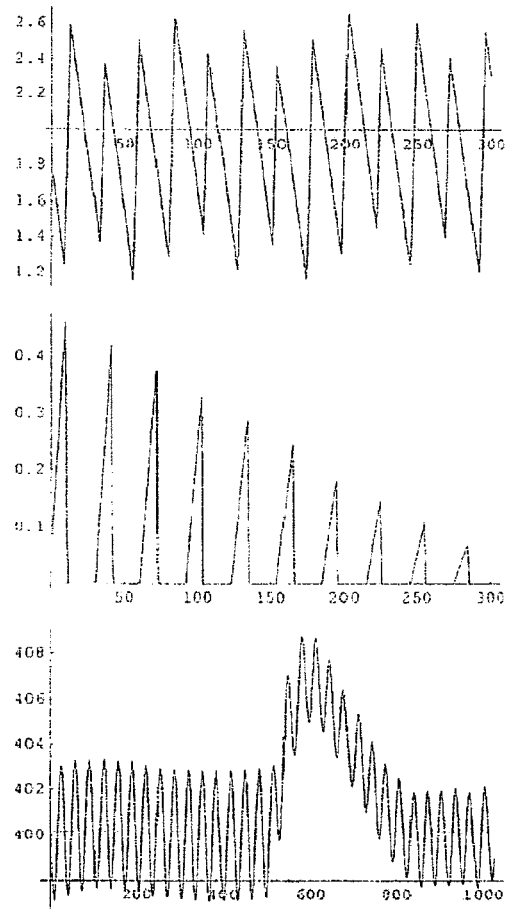
Figure 15I:
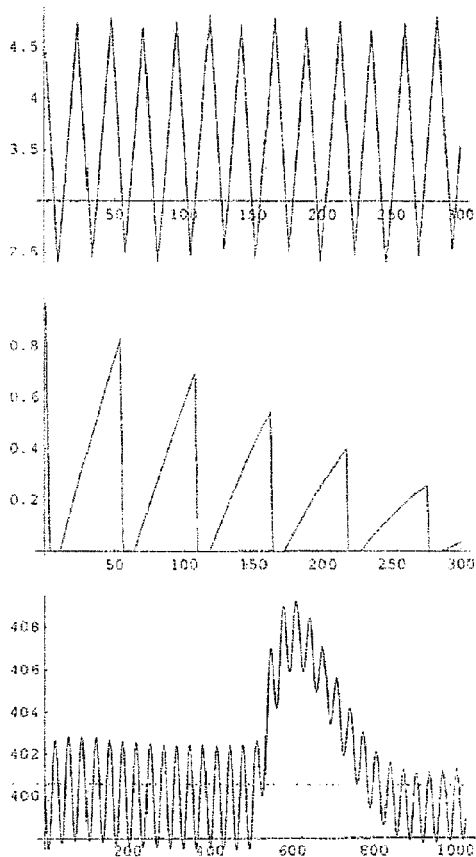
Figure 15J:
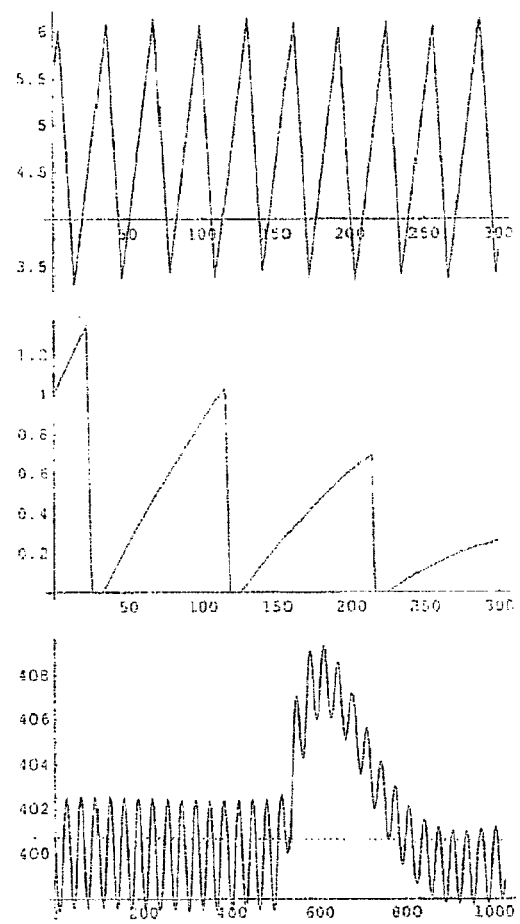

FIG. 7A depicts a transfer function of the representative voltage $V_x$ function generator of FIG. 6C showing the off-time-to-minimum off-time ratio ($t_{off}/t_{offmin}$) being mapped against values of line input voltage ($V_x$). FIG. 7A generally shows how the off-time $t_{off}$ varied as a function (such, as exemplary piece-wise linear function) of the instantaneous line voltage $V_x$. This function can be chosen to maximize efficiency, and the function can alternatively be a mathematical function or a lookup table function. This relationship is used to determine for a given input voltage source (E.g., 120 Volt or 240 Volt) how the line voltage $V_x$ varies over a given time period and how the ratio of off-time to a minimum off-time $t_{off}/t_{offmin}$ varies over the same time period. An exemplary Mathematica code implementation of off-time being varied as a piece-wise linear function of the instantaneous line voltage Vx is shown in lines 33 to 38 of FIG. 14C.

Figure 7B:
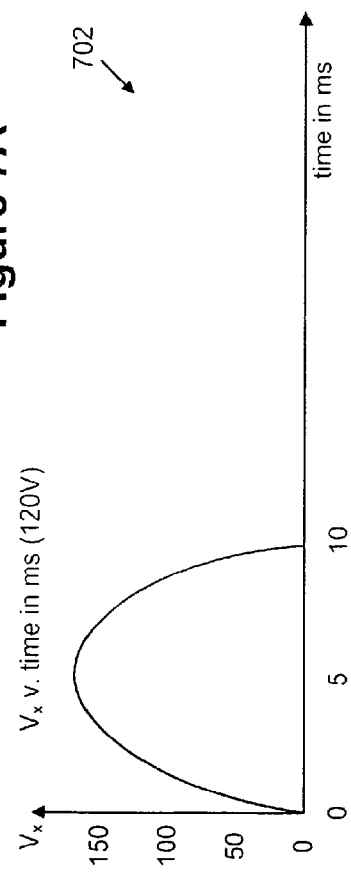
FIG. 7B depicts a 10 millisecond cycle of line input voltage $V_x(t)$ when the input voltage $V_{in}(t)$ is operated at a 120 Volt (RMS) Input Voltage Source.
Figure 7C:
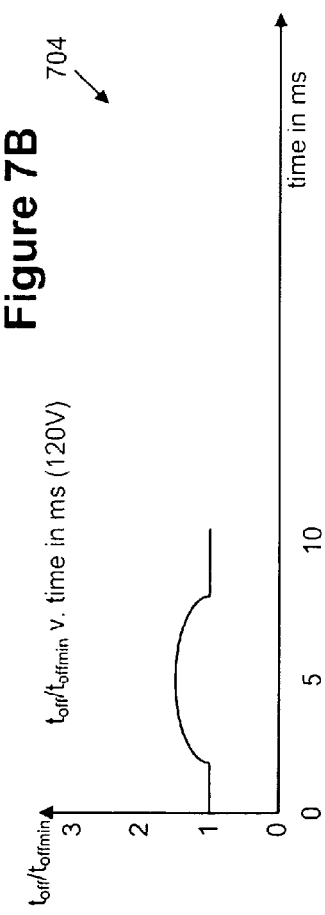
FIG. 7C depicts the 10 millisecond cycle of FIG. 7B showing the resulting off-time-to-minimum off-time ratios when the transfer function of FIG. 7A is applied over the 10 millisecond cycle of line input voltage $V_x(t)$ shown in FIG. 7B.

FIG. 7B depicts a line input voltage $V_x(t)$ over a ten (10) millisecond cycle when the input voltage $V_{in}(t)$ is operated at a 120 Volt (RMS) input voltage source. FIG. 7C depicts the same 10 millisecond cycle of FIG. 7B showing the resulting off-time-to-minimum off-time ratios when the transfer function of FIG. 7A is applied over the 10 millisecond cycle of line input voltage $V_x(t)$ shown in FIG. 7B. In this example illustrated in FIGS. 7B and 7C, the value for link output voltage Vc(t) is 400 Volts (e.g., the voltage across link capacitor 206 in FIGS. 2A and 2B). The maximum peak value for line voltage $V_x$ is equal to 120 Volts (RMS) multiplied √2 (Square Root of 2) which is about 170 Volts. The ratio of off-time to minimum off-time ratio $t_{off}/t_{offmin}$ in this case varies from 1 to 1.3. Therefore, if the minimum off time $t_{offmin}$ is set to 8 microseconds, then the off time $t_{off}$ at the peak of the input sine wave (e.g., 170 Volts at 5 milliseconds in FIG. 7B) would be 10.4 microseconds.

As shown in FIG. 7B, graph 702 illustrates the line voltage increasing from 0 V to 170 V over the first 5 ms of the 10 ms period and then decreasing from 170 V to 0 V over the second 5 ms of the 10 ms period. Over this same 10 ms period. FIG. 7C shows graph 704 which depicts that the ratio $t_{off}/t_{offmin}$ stays at 1 for the first couple of milliseconds, rises to 1.3 at 5 ms, falls to 1 over the next couple of milliseconds, and stays at 1 through 10 ms. FIGS. 7B and 7C are viewed at the line input rate scale, so at that time scale, off-time $t_{off}$ appears to be varying over an exemplary 10 ms sense cycle. However, at the perspective of the switch rate scale (e.g., 10 microseconds relating to 100 kHz), the off-time $t_{off}$ would be considered not to be varying rapidly.

Figure 8A:
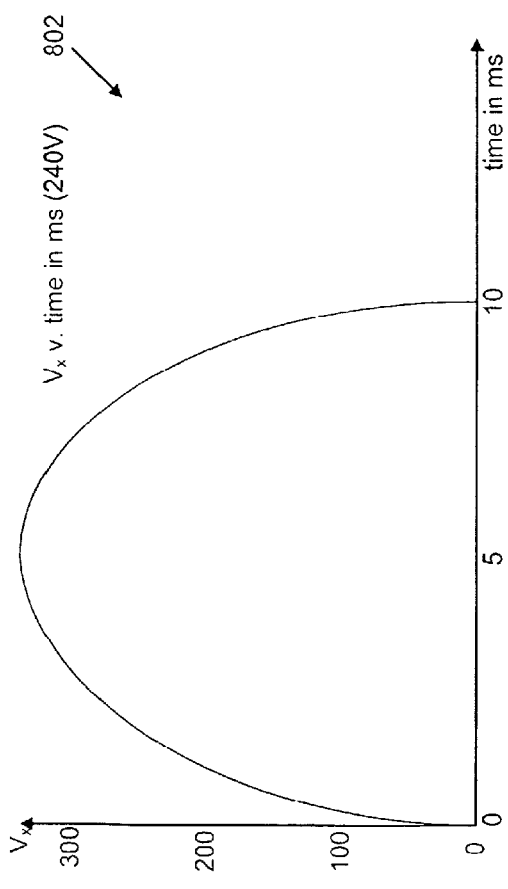
FIG. 8A depicts a 10 millisecond cycle of a line input voltage $V_x(t)$ when the input voltage $V_{in}(t)$ is operated at a 240 Volt (RMS) Input Voltage Source.
Figure 8B:
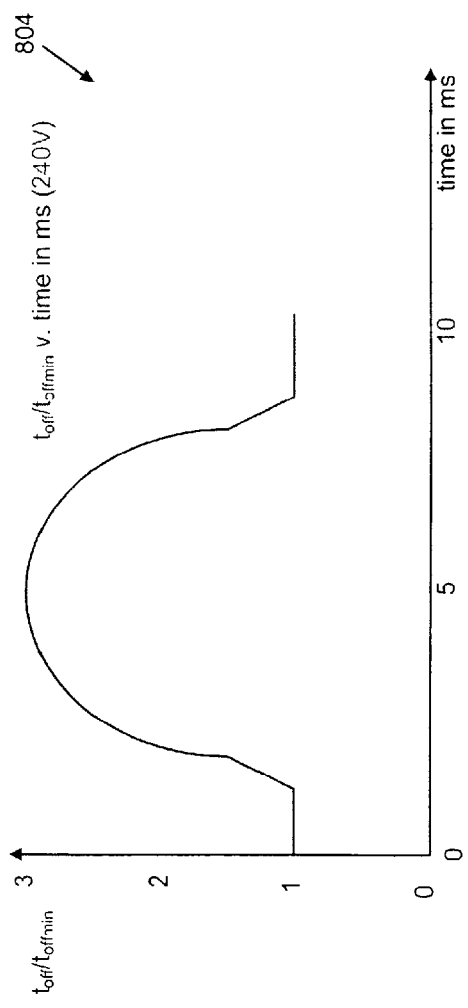
FIG. 8B depicts the 10 millisecond cycle of FIG. 8A showing the resulting off-time-to-minimum off-time ratios when the transfer function of FIG. 7A is applied over the 10 millisecond cycle of line input voltage $V_x(t)$ shown in FIG. 8A.

FIG. 8A depicts a line input voltage $V_x(t)$ over a ten (10) millisecond cycle when the input voltage $V_{in}(t)$ is operated at a 240 Volt (RMS) input voltage source. FIG. 8B depicts the same 10 millisecond cycle of FIG. 8A showing the resulting FIGS. 8A and 8B are viewed at the line input rate scale, so at that time scale, off-time $t_{off}$ appears to be varying over an exemplary 10 ms cycle. However, at the perspective of the switch rate scale (e.g., 10 microseconds relating to 100 kHz line rate), the off-time $t_{off}$ would be considered not to be varying rapidly.

With reference now to FIG. 9A, exemplary waveforms of the switch current $i_{senseA}$ and target current $i_{target}$ are shown at the switch rate scale for a preferred exemplary control technique of control switch 208. Target current $i_{target}$ is considered and viewed as switch rate stationary relative to switch current $i_{senseA}$. Switch current $i_{senseA}$ is shown during the on-times of switch current as being fifty percent (50%) above (e.g., above-time duration) and fifty percent (50%) below (e.g., below-time duration) the target current $i_{target}$. With reference now to FIG. 9B, exemplary waveforms of the boost inductor current $i_{senseB}$ and target current $i_{target}$ are shown at the switch rate scale. Target current $i_{target}$ is considered and viewed as switch rate stationary relative to boost inductor current $i_{senseB}$. Boost inductor current $i_{senseB}$ is shown during the on-times of switch current as being fifty percent (50%) above and fifty percent (50%) below the target current $i_{target}$ during a switching period (e.g., $t_{onA}+t_{onB}+t_{off}$) The waveforms in FIGS. 9A and 9B help illustrate an exemplary control technique that would be implemented by an FSM algorithm for FSM 304.

As previously indicated, switch current $i_{senseA}$ in switch-mode boost stage 202A and boost inductor current $i_{senseB}$ in switching power converter 202B may be generically referred to as sensed current signal $i_{sense}$. Time-based controller 410 is used to adjust the switch timing such that the sensed current $i_{sense}$ (e.g., switch current $i_{senseA}$ or boost inductor current $i_{senseB}$) is above the target current ($i_{target}$) threshold fifty percent (50%) of the on-time $t_{on}$ of switch 208 and below the target current ($i_{target}$) threshold the other fifty percent (50%) of the on-time $t_{on}$, and the FSM algorithm (e.g., switch control algorithm) treats the target current $i_{target}$ as being switch rate stationary relative to sensed current $i_{sense}$.

The boost inductor current $i_L$ comprise approximately linear ramps, and these linear ramps ensure that the average current of boost inductor current $i_L$ (e.g., line input current) tracks the target current $i_{target}$. In this exemplary control technique embodiment, the first method of varying duty cycle is implemented in which the on-time $t_{on}$ of switch 208 (e.g., $t_{onA}$ and $t_{onB}$ shown in FIGS. 7A, 7B, and 9) is varied and the off-time $t_{off}$ is considered to be maintained as a constant over periodic cycles of sensed current $i_{sense}$ when viewed at the switch rate scale. Thus, this control technique only requires the sensed current $i_{sense}$ be sensed when switch 208 is activated or "ON", making it compatible with the sense resistor 209A of FIG. 2A and sense resistor 209B of FIG. 2B. Because time-based controller 410 enables control of the switch timing for switch 208 as described above, a PI controller associated with current loop 216 is not needed or required, and thus complexity of the circuit for power factor correctors 200A and 200B can be simplified.

With reference now to FIG. 10, a state diagram 1000 is shown for the FSM 304 shown in FIGS. 3 and 4. State diagram 1000 shows how the FSM algorithms (e.g., switch control algorithms) are implemented for the embodiments of power factor correctors 202A and 202B. FIGS. 9A, 9B, and 10 are now discussed together. A timer is implemented with an oscillator 432 and a digital counter in which the clock from oscillator 432 drives the clock input of the counter. A digital counter with a pre-set and up/down count is well known in the art.

State diagram 1000 shows that for this preferred control technique embodiment, FSM algorithm moves to a state S0 in which the digital counter is reset. At state S0, switch 208 is on, and a count value $T_{onA}$ is started. Count value $T_{onA}$ is used to determine and track the lapsed time for on-time $t_{onA}$ of switch 208. Sensed current $i_{sense}$ is compared with target current $i_{target}$ by comparator 303 comparing sensed current voltage $V(i_{sense})$ with reference voltage $V(i_L)$ which corresponds to a target current $i_{target}$. While sensed current $i_{sense}$ continues to be less than target current $i_{target}$, then new count value $T_{onA}'$ is used to calculate an updated count value for $T_{onA}$ by adding one (1) to the current value of $T_{onA}$, that is, $$T_{onA}'=T_{onA}+1 \qquad \text{Equation A}$$

The count value $T_{onA}$ is then captured in a latch when comparator 303 changes state, that is, when sensed current $i_{sense}$ becomes greater than or equal to target current $i_{target}$. Count value $T_{onB}$ is used to determine and track the lapsed time for on-time $t_{onB}$ of switch 208. New count value $T_{onB}'$ is calculated by adding the old count value $T_{onB}$ with the captured count value $T_{onA}$ and dividing this sum by two (2) for providing an updated on-time $t_{onB}$, that is, $$T_{onB}'=(T_{onB}+T_{onA})/2 \qquad \text{Equation B}$$

The digital counter is then reset.

The FSM algorithm moves to state S1 in which switch 208 is still on while the timer tracks whether the current count value $T_{onB}$ has been reached, which reflects the updated on-time $t_{onB}$ having lapsed. When the count value $T_{onB}$ has been reached, FSM algorithm then moves to state S2 in which the switch 208 is off. Digital counter is then reset again. A count value $T_{off}$ is used to determine and track the lapsed time for off-time $t_{off}$ of switch 208, and the count value $T_{off}$ is determined as a function of the line input voltage $V_x(t)$. When the digital counter reaches the count value $T_{off}$, FSM algorithm loops back to state S0 and repeats thereafter. In parallel with the execution of the FSM algorithm in accordance with the state diagram 1000, voltage loop 218 is updated at the line rate (e.g., 100 Hz or 120 Hz).

With reference now to FIG. 11, exemplary waveforms of the switch current $i_{senseA}$, which is the switch current in FIG. 2A, and a peak current $i_{PEAK}$ is shown at the switch rate scale for another preferred exemplary control technique of control switch 208. Target current $i_{target}$ is calculated proportionate to the line input voltage $V_x(t)$ as discussed in the previous embodiment, and peak current $i_{PEAK}$ is considered and viewed as switch rate stationary relative to switch current $i_{senseA}$. Switch current $i_{senseA}$ is shown as ramping up by switch 208 being turned on until switch current $i_{senseA}$ reaches the peak current $i_{PEAK}$. When switch current $i_{senseA}$ reaches peak current $i_{PEAK}$, switch 208 is then turned off for an off-time period $t_{off}$.

Ripple current $i_{RIPPLE}$ is calculated as the difference between the minimum and maximum values of the inductor current $i_L$ over one period. The peak-to-peak inductor ripple current $i_{RIPPLE}$ is calculated as the off-time $t_{off}$ multiplied by the difference of scaled link output voltage $V_c(t)$ and line input voltage $V_x(t)$ divided by the inductance value L of inductor 210, that is:

$$i_{RIPPLE}=t_{off}*(V_c(t)-V_x(t))/L \qquad \text{Equation C}$$

The desired peak current in the inductor is:

$$i_{PEAK}=i_{target}+i_{RIPPLE}/2 \qquad \text{Equation D}$$

Thus, if the inductor value L is known to a reasonable accuracy, then the peak current $i_{PEAK}$ can be controlled. Thus, the inductor value L may be determined by run-time measurement. For example, if the time is measured for the switch current $i_{senseA}$ to go from target current $i_{target}$ to $i_{peak}$, then the inductance value can be determined as $Vx(t)*(\text{delta time}/\text{delta current})$.

With reference now to FIG. 12, state diagram 1200 shows that for this preferred control technique embodiment, FSM algorithm moves to a state S0 in which switch 208 is on. State diagram 1200 then depicts that FSM algorithm waits until the condition in which peak current $i_{PEAK}$ is greater than the sum of the target current $i_{target}$ and ripple current $i_{RIPPLE}$ divided by two (2), that is, $$I_{sense}>i_{target}+i_{RIPPLE}/2 \qquad \text{Equation E}$$

When the above condition is met, then FSM algorithm shown in state diagram 1200 moves to state S1 in which switch 208 is turned on. FSM algorithm then waits a "constant" off-time (as discussed earlier) and then goes back to state S0 and repeats thereafter.

Exemplary waveforms in FIGS. 7A, 7B, 7C, 8A, 8B, 9A, 9B, 10, 11, and 12 define the functions and operations of the control technique algorithms for controlling switch 208. The characteristics of these functions and operations determine the operating behavior of and operating frequencies for the power factor correctors 200A and 200B. As such, it is desirable to allow configuration of the operating parameters for different applications. In the preferred embodiment, the parameters are stored in digital registers which can be loaded from an external memory. For example, a read-only memory (ROM), an Electrically Erasable Programmable Read-Only Memory (EEPROM), a flash memory, or a one-time programmable (OTP) memory may be used to store the chosen values, and these values are loaded into the digital registers at power up of the power factor correctors 200A or 200B. Default values for at least some of the registers may be set. The programming of the memories allow for the configuration of different applications for a programmable power factor corrector.

Exemplary programmable power factor correctors are discussed and disclosed in pending U.S. patent application Ser. No. 11/967,275 filed on Dec. 31, 2007 entitled "Programmable Power Control System" to John Melanson and assigned to common assignee Cirrus Logic, Inc., Austin, Tex. (hereafter the "Programmable Power Control Systems patent case"). The Programmable Power Control Systems patent case is hereby incorporated by reference.

Figure 13:
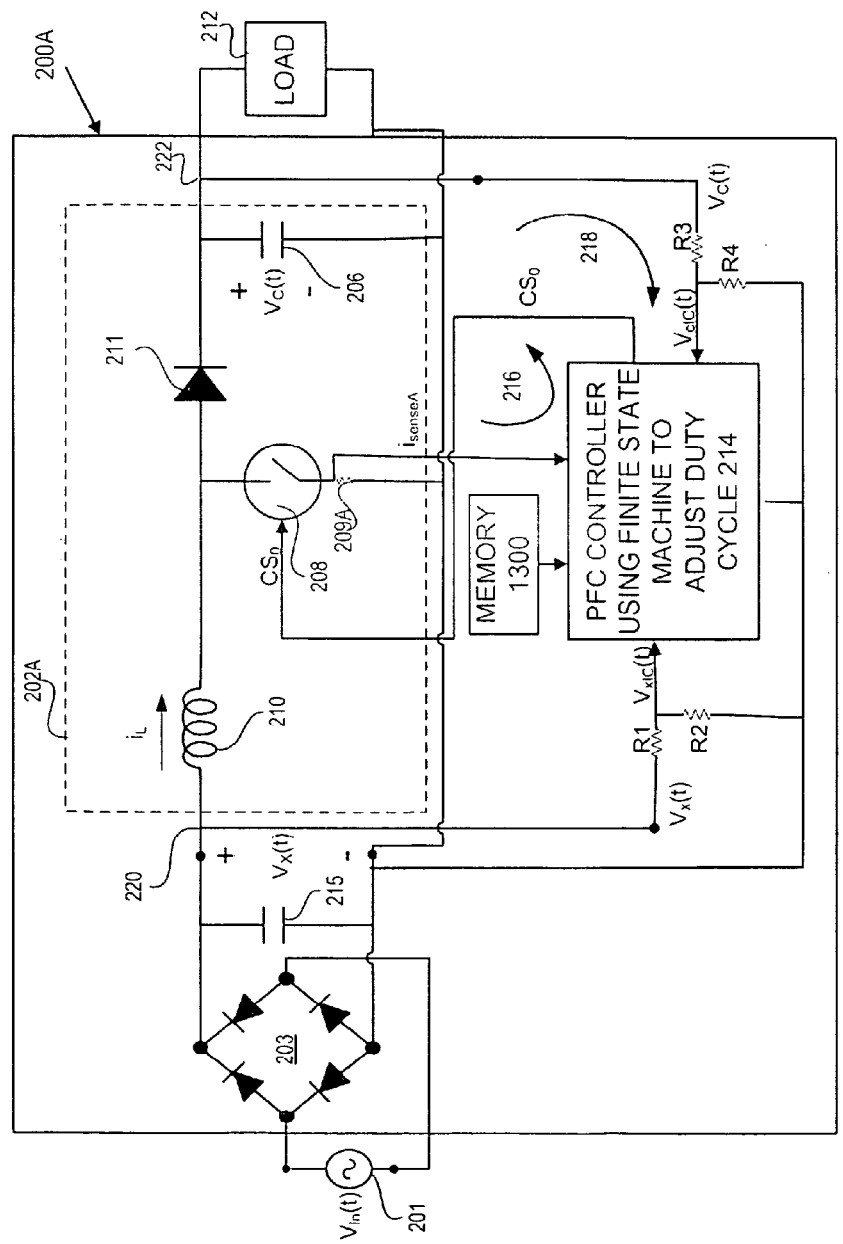
FIG. 13 depicts a power factor corrector of FIG. 2A coupled to a memory.

FIG. 13 depicts an exemplary power factor corrector 200A which incorporates a memory 1300 that is coupled to PFC controller 214. Memory 1300 stores operational parameters, such as the exemplary parameters (e.g., inductor value 654, time interval (such as off-time $t_{off}$ or sensed current period parameters 656, power level 658, RMS level 660) for defining the transfer function of voltage $V_x$ function generator 652. In at least one embodiment, memory 1300 is a nonvolatile storage medium. Memory 1300 can be, for example, a read/write memory, a one time programmable memory, a memory used for table lookup, or a loadable register. How and when the PFC operational parameters are loaded into and accessed from memory 1300 is a design choice.

FIGS. 14A to 14J depict Mathematica code (i.e., Mathematica is an engineering computer program developed by Wolfram Research in Champaign, Ill.) for an exemplary implementation of the functions of the control technique algorithm as depicted by FIGS. 9A, 9B, and 10. FIGS. 15A to 15J depict Mathematica code for an exemplary implementation of the functions of the control technique algorithm as depicted by FIGS. 11 and 12.

Although the present invention has been described in detail, it should be understood that various changes, substitutions and alterations can be made hereto without departing from the spirit and scope of the invention as defined by the appended claims.

What is claimed is:

1. A power factor corrector (PFC), comprising:
   a switch-mode boost stage having a switch and an inductor coupled to the switch wherein the switch-mode boost stage receives a rectified line input voltage and provides a link output voltage and wherein a sensed current is observed from the switch-mode boost stage; and
   a target current generator for receiving the link output voltage and for generating a target current proportionate to the rectified line input voltage;
   a comparator for receiving a target current value representative of the target current and a sensed current value representative of the sensed current and outputting a two-level current comparison result signal; and a finite state machine responsive to the two-level current comparison result signal, generating a switch control signal that has a duty cycle which is adjusted for controlling the switch so that the sensed current is approximately proportionate to the rectified line input voltage, such that power factor correction is performed.

2. The PFC of claim 1, wherein the sensed current is a switch current of the switch.

3. The PFC of claim 2 wherein the finite state machine generates the switch control signal such that the switch current is greater than the target current during approximately fifty percent of an on-time duration of the switch and less than the target current during a remaining approximately fifty percent of the on-time duration of the switch.

4. The PFC of claim 1 wherein the sensed current is a boost inductor current in the inductor.

5. The PFC of claim 4 wherein the finite slate machine generates the switch control signal such that the boost inductor current is greater than the target current during approximately fifty percent of an on-time duration of the switch and less than the target current during a remaining approximately fifty percent of the on-time duration of the switch.

6. The PFC of claim 1 further comprising a timer which is utilized by the finite state machine for measuring a below-time duration in which the sensed current is less than the target current and adjusting the duly cycle of the switch control signal in conformity with the below-time duration.

7. The PFC of claim 6 further comprising a time duration generator which receives a signal representative of the rectified line input voltage and adjusts an off-time duration of the switch in conformity with the below-time duration.

8. The PFC of claim 7 further comprising a detector for detecting a RMS voltage of the line input voltage and wherein the time duration generator receives and uses the RMS voltage to responsively determine the off-time duration.

9. The PFC of claim 7 wherein a power level is detected from the link output voltage and wherein the time duration generator receives and uses the power level to responsively determine the off-time duration.

10. The PFC of claim 6 further comprising a time duration generator which receives a signal representative of the rectified line input voltage and adjusts a switching period for the switch in conformity with the below-time duration.

11. The PFC of claim 10 further comprising a detector for detecting a RMS voltage of the line input voltage and wherein the time duration generator receives and uses the RMS voltage to responsively determine the switching period.

12. The PFC of claim 10 wherein a power level is detected from the link output voltage and wherein the time duration generator receives and uses the power level to responsively determine the switching period.

13. The PFC of claim 6 wherein the finite state machine calculates an on-time duration based on a recurrence relation responsive to a prior on-time duration and the below-time duration.

14. The PFC of claim 6 wherein the timer further comprises:
an oscillator; and
a digital counter that counts responsively to the oscillator and the two-level current comparison result signal; and
wherein the switch control signal controls the switch in response to the digital counter.

15. The PFC of claim 1 wherein the target current generator, the comparator, and the finite state machine are incorporated into a single integrated circuit.

16. The PFC of claim 15 wherein the integrated circuit further comprises a timer that includes an oscillator and a counter.

17. A method for power factor correction (PFC), comprising:
coupling a switch and an inductor together to form a switch-mode boost stage that receives a rectified line input voltage and provides a link output voltage;
observing a sensed current from the switch-mode boost stage;
receiving a link output voltage;
generating a target current proportionate to the rectified line input voltage;
comparing a target current value representative of the target current and a sensed current value representative of the sensed current;
in response to the comparing, outputting a two-level current comparison result signal; and
in response to the two-level current comparison result signal, generating a switch control signal that has a duty cycle which is adjusted for controlling the switch so that the sensed current is approximately proportionate to the rectified line input voltage, such that power factor correction is performed.

18. The method of claim 17, wherein sensing a sensed current from the switch-mode boost stage further comprises:
sensing a switch current of the switch.

19. The method of claim 18 wherein generating a switch control signal further comprises:
generating the switch control signal such that the switch current is greater than the target current during approximately fifty percent of an on-time duration of the switch and less than the target current during a remaining approximately fifty percent of the on-time duration of the switch.

20. The method of claim 17 wherein sensing a sensed current from the switch-mode boost stage further comprises:
sensing a boost inductor current in the inductor.

21. The method of claim 20 wherein generating a switch control signal further comprises:
generating the switch control signal such that the boost inductor current is greater than the target current during approximately fifty percent of an on-time duration of the switch and less than the target current during a remaining approximately fifty percent of the on-time duration of the switch.

22. The method of claim 17 further comprising:
measuring a below-time duration in which the sensed current is less than the target current; and
adjusting an on-time duration of a switching time period for the switch in conformity with the below-time duration.

23. The method of claim 22 further comprising:
adjusting an off-time duration of the switch in conformity with the below-time duration.

24. The method of claim 22 further comprising:
adjusting a switching period for the switch in conformity with the below-time duration.

25. The method of claim 22 further comprising:
calculating an on-time duration of the switch based on a recurrence relation responsive to a prior on-time duration and the below-time duration.

26. An integrated circuit which incorporates a power factor correction controller that includes a target current generator, a comparator, and a finite state machine, the integrated circuit configured to:

receive a signal representative of a rectified line input voltage;

observe a sensed current from an external switch-mode boost stage;

receive another signal representative of a link output voltage;

generate a target current proportionate to the input signal;

compare a target current value representative of the target current and a sensed current value representative of the sensed current;

in response to the compare, output a two-level current comparison result signal; and in response to the two-level current comparison result signal, generate a switch control signal that has a duty cycle which is adjusted for controlling the switch so that the sensed current is approximately proportionate to the rectified line input voltage, such that power factor correction is performed.

27. A power factor corrector (PFC), comprising:

a switch-mode boost stage having a switch and an inductor coupled to the switch wherein the switch-mode boost stage receives a rectified line input voltage and provides a link output voltage and wherein a sensed current is observed from the switch-mode boost stage; and a target current generator for receiving the link output voltage and for generating a target current proportionate to the rectified line input voltage;

a ripple current estimator for generating a ripple current that estimates a peak-to-peak inductor ripple current;

a comparator, responsive to the target current, the ripple current, and the sensed current, for outputting a two-level current comparison result signal; and a finite slate machine responsive to the two-level current comparison result signal, generating a switch control signal that has a duty cycle which is adjusted for controlling the switch so that the sensed current is approximately proportionate to the rectified line input voltage, such that power factor correction is performed.

28. The PFC of claim 27, wherein the finite state machine turns on the switch for an on-time duration starting when the sensed current is less than a sum of the target current and half of the ripple current and the finite state machine turns off the switch for an off-time duration starting when the sensed current is greater than or equal to a sum of the target current and half of the ripple current.

29. The PFC of claim 27 wherein the off-time duration is adjusted in conformity with the ripple current.

30. The PFC of claim 27 further comprising a timer that includes an oscillator and a counter wherein the timer is utilized by the finite state machine to measure an on-time duration and an off-time duration of the switch.

31. The PFC of claim 27 wherein the target current generator, the comparator, and the finite state machine are incorporated into a single integrated circuit.

32. A method for power factor correction (PFC), comprising:

coupling a switch and an inductor together to form a switch-mode boost stage that receives a rectified line input voltage;

observing a sensed current from the switch-mode boost stage;

receiving a link output voltage;

generating a target current proportionate to the rectified line input voltage;

generating a ripple current that estimates a peak-to-peak inductor ripple current;

in response to the target current, the ripple current, and the sensed current, generating a two-level current comparison result signal; and in response to the two-level current comparison result signal, generating a switch control signal that has a duty cycle which is adjusted for controlling the switch so that the sensed current is approximately proportionate to the rectified line input voltage, such that power factor correction is performed.

33. The method of claim 32, wherein generating a switch control signal further comprises:

turning on the switch for an on-time duration starting when the sensed current is less than a sum of the target current and half of the ripple current; and turning off the switch for an off-time duration starting when the sensed current is greater than or equal to a sum of the target current and half of the ripple current.

34. The method of claim 33 further comprising:

adjusting the off-time duration in conformity with the ripple current.

35. An integrated circuit which incorporates a power factor correction controller that includes a target current generator, a comparator, and a finite state machine, the integrated circuit configured to:

receive a signal representative of a rectified line input voltage;

observe a sensed current from an external switch-mode boost stage;

receive another signal representative of a link output voltage;

generate a target current proportionate to the rectified line input voltage;

generate a ripple current that estimates a peak-to-peak inductor ripple current;

in response to the target current, the ripple current, and the sensed current, generate a two-level current comparison result signal; and in response to the two-level current comparison result signal, generate a switch control signal that has a duty cycle which is adjusted for controlling the switch so that the sensed current is approximately proportionate to the rectified line input voltage, such that power factor correction is performed.

* * * * *